United States Patent
Lee et al.

(10) Patent No.: US 7,530,002 B2
(45) Date of Patent: May 5, 2009

(54) SUB-MATRIX-BASED IMPLEMENTATION OF LDPC (LOW DENSITY PARITY CHECK) DECODER

(75) Inventors: Tak K. Lee, Irvine, CA (US); Hau Thien Tran, Irvine, CA (US); Ba-Zhong Shen, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 649 days.

(21) Appl. No.: 11/360,267

(22) Filed: Feb. 23, 2006

(65) Prior Publication Data

US 2007/0157061 A1 Jul. 5, 2007

Related U.S. Application Data

(60) Provisional application No. 60/755,803, filed on Jan. 3, 2006.

(51) Int. Cl.
*H03M 13/00* (2006.01)
(52) U.S. Cl. .................... 714/758; 714/752
(58) Field of Classification Search ............ 714/752, 714/758
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 6,938,196 B2* | 8/2005 | Richardson et al. | 714/752 |
| 6,957,375 B2* | 10/2005 | Richardson | 714/752 |
| 7,246,304 B2* | 7/2007 | Kim | 714/801 |
| 7,299,397 B2* | 11/2007 | Yokokawa et al. | 714/752 |
| 7,401,283 B2* | 7/2008 | Shen et al. | 714/758 |
| 7,415,079 B2* | 8/2008 | Cameron et al. | 375/340 |
| 7,454,685 B2* | 11/2008 | Kim et al. | 714/758 |
| 2003/0104788 A1 | 6/2003 | Kim | |

(Continued)

OTHER PUBLICATIONS

R. G. Gallager, "Low density parity check codes," IRE Trans. Info. Theory, vol. IT-8, pp. 21-28, Jan. 1962.

(Continued)

*Primary Examiner*—M. Mujtaba K Chaudry
(74) *Attorney, Agent, or Firm*—Garlick Harrison & Markison; Shayne X. Short

(57) ABSTRACT

Sub-matrix-based implementation of LDPC (Low Density Parity Check) decoder. A novel approach is presented by which an LDPC coded signal is decoded by processing 1 sub-matrix at a time. A low density parity check matrix corresponding to the LDPC code includes rows and columns of sub-matrices. For example, when performing bit node processing, 1 or more sub-matrices in a column are processed; when performing check node processing, 1 or more sub-matrices in a row are processed. If desired, when performing bit node processing, the sub-matrices in each column are successively processed together (e.g., all column 1 sub-matrices, all column 2 sub-matrices, etc.). Analogously, when performing check node processing, the sub-matrices in each row can be successively processed together (e.g., all row 1 sub-matrices, all row 2 sub-matrices in row 2, etc.).

20 Claims, 36 Drawing Sheets

U.S. PATENT DOCUMENTS

2005/0149844 A1* 7/2005 Tran et al. .................. 714/800
2005/0262420 A1* 11/2005 Park et al. .................. 714/758
2006/0107179 A1* 5/2006 Shen et al. ................. 714/758
2006/0274772 A1* 12/2006 Kim et al. .................. 370/412

OTHER PUBLICATIONS

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2, pp. 599-618, Feb. 2001.

* cited by examiner

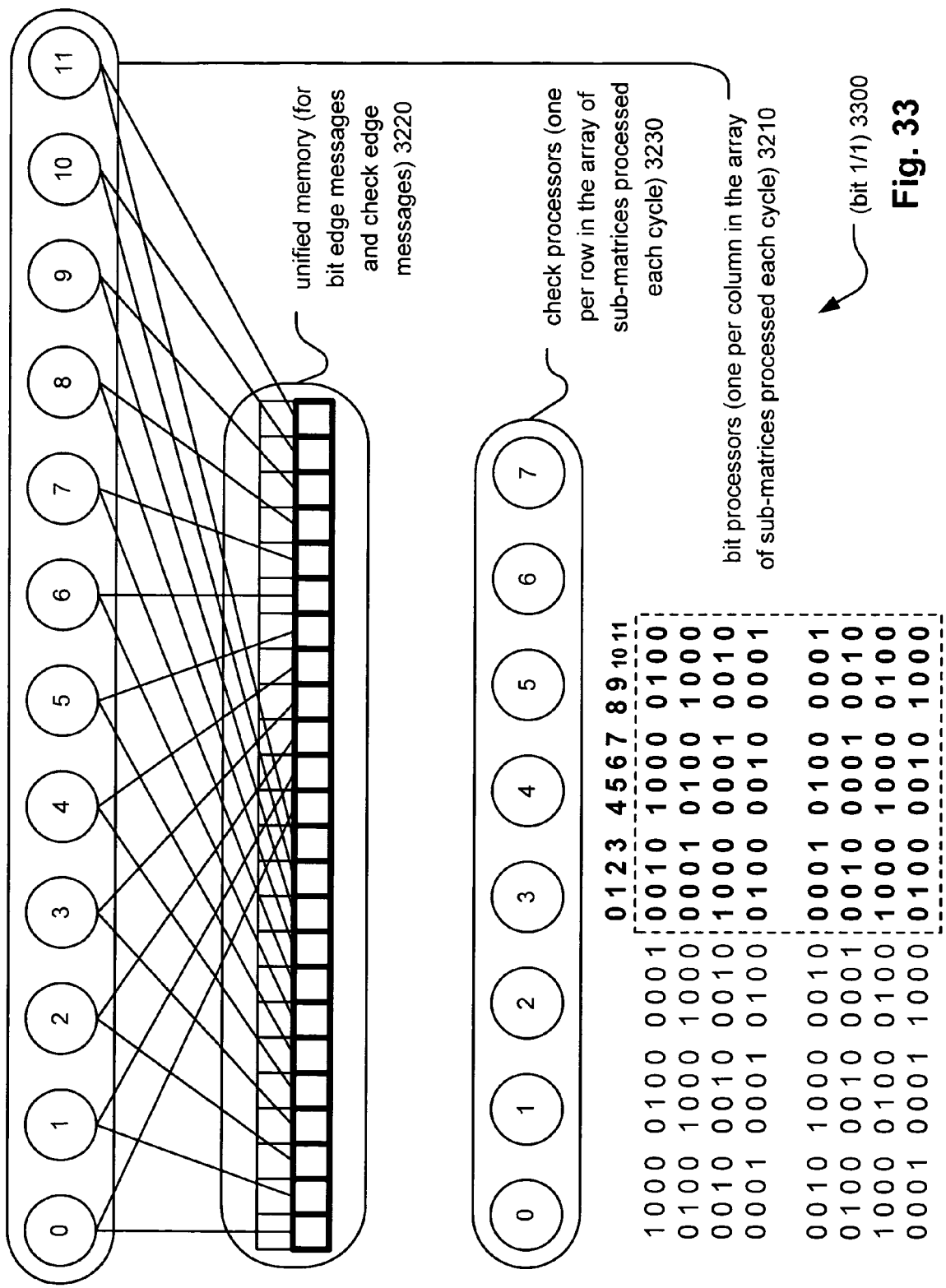

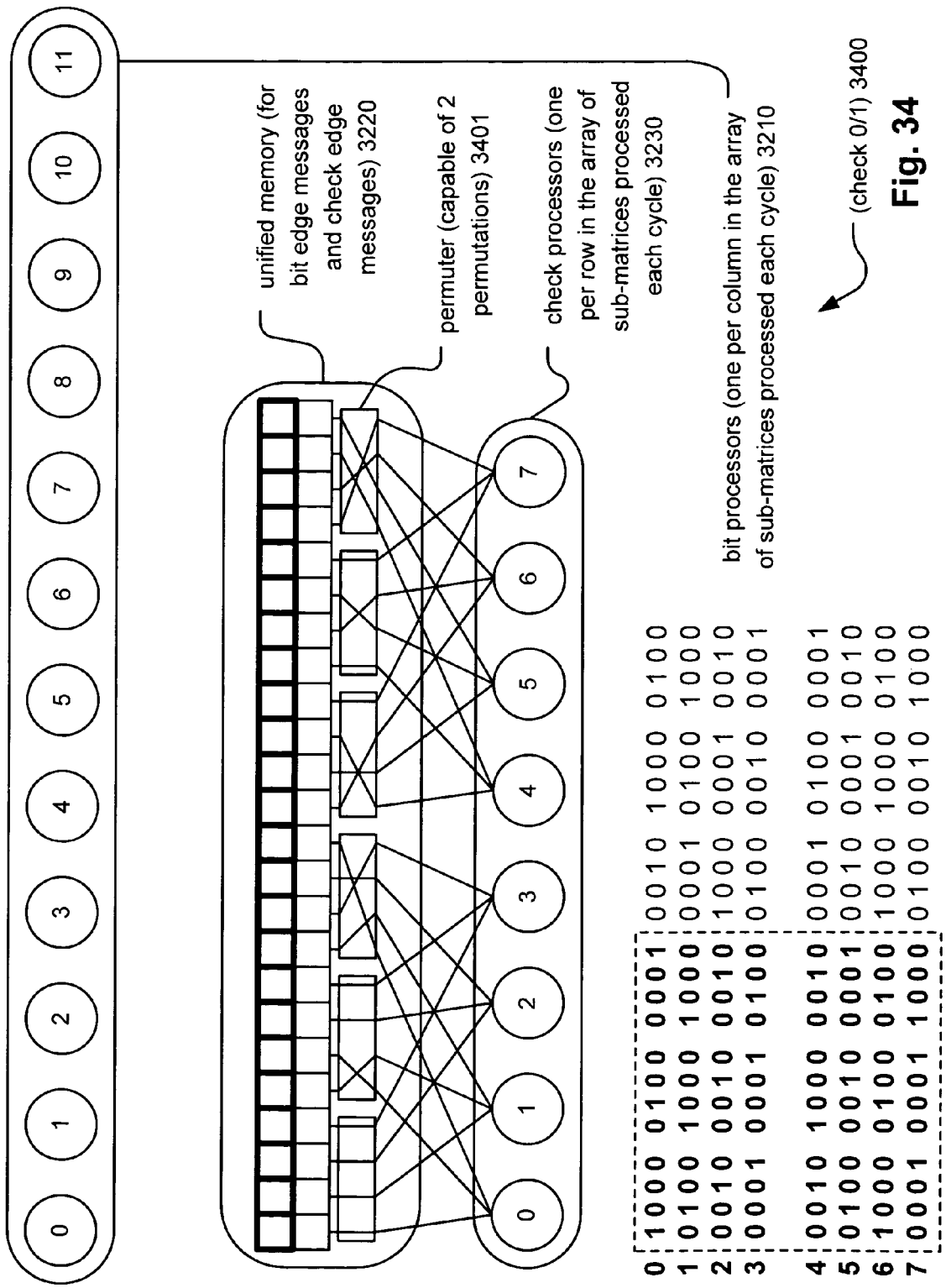

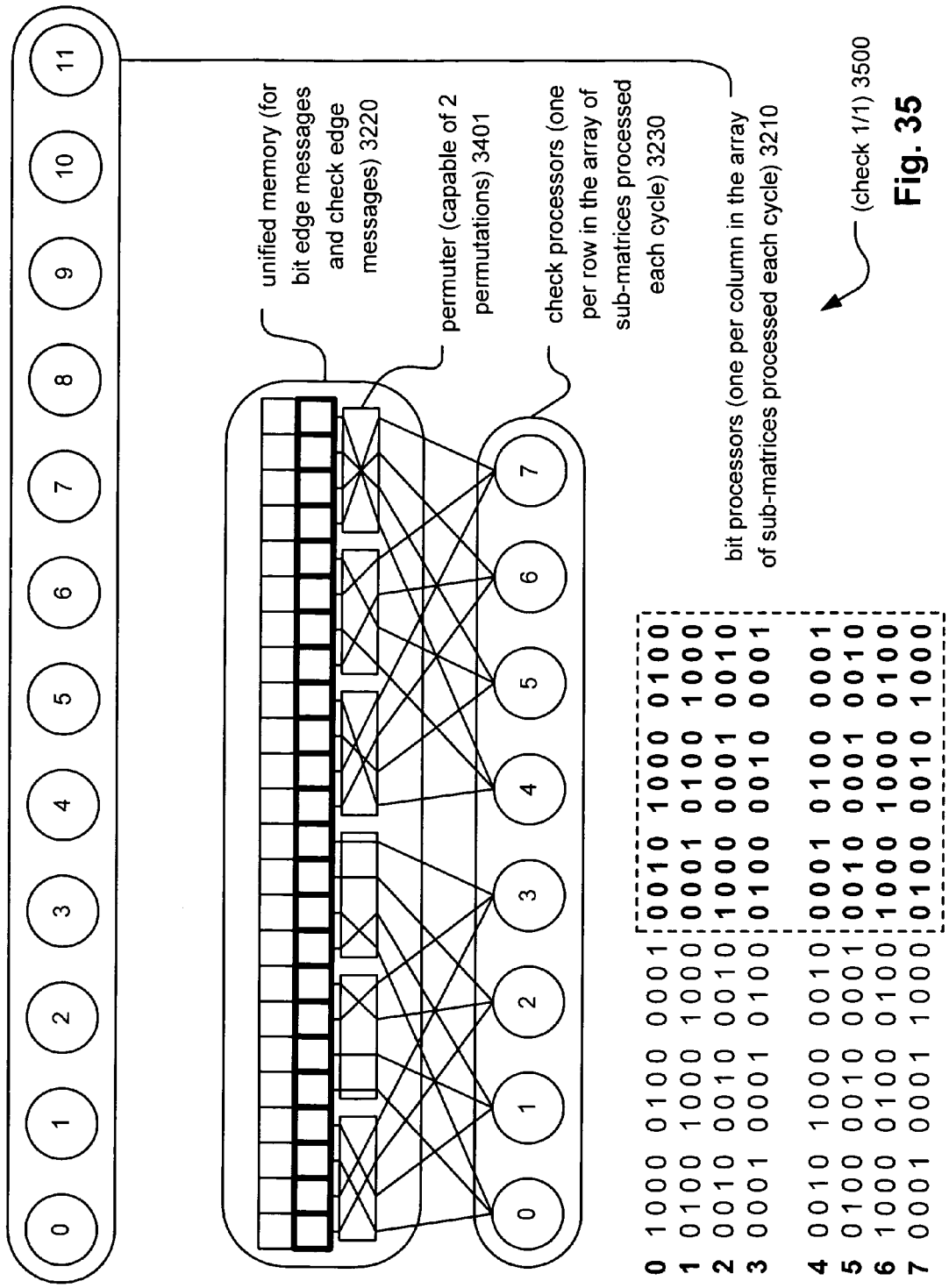

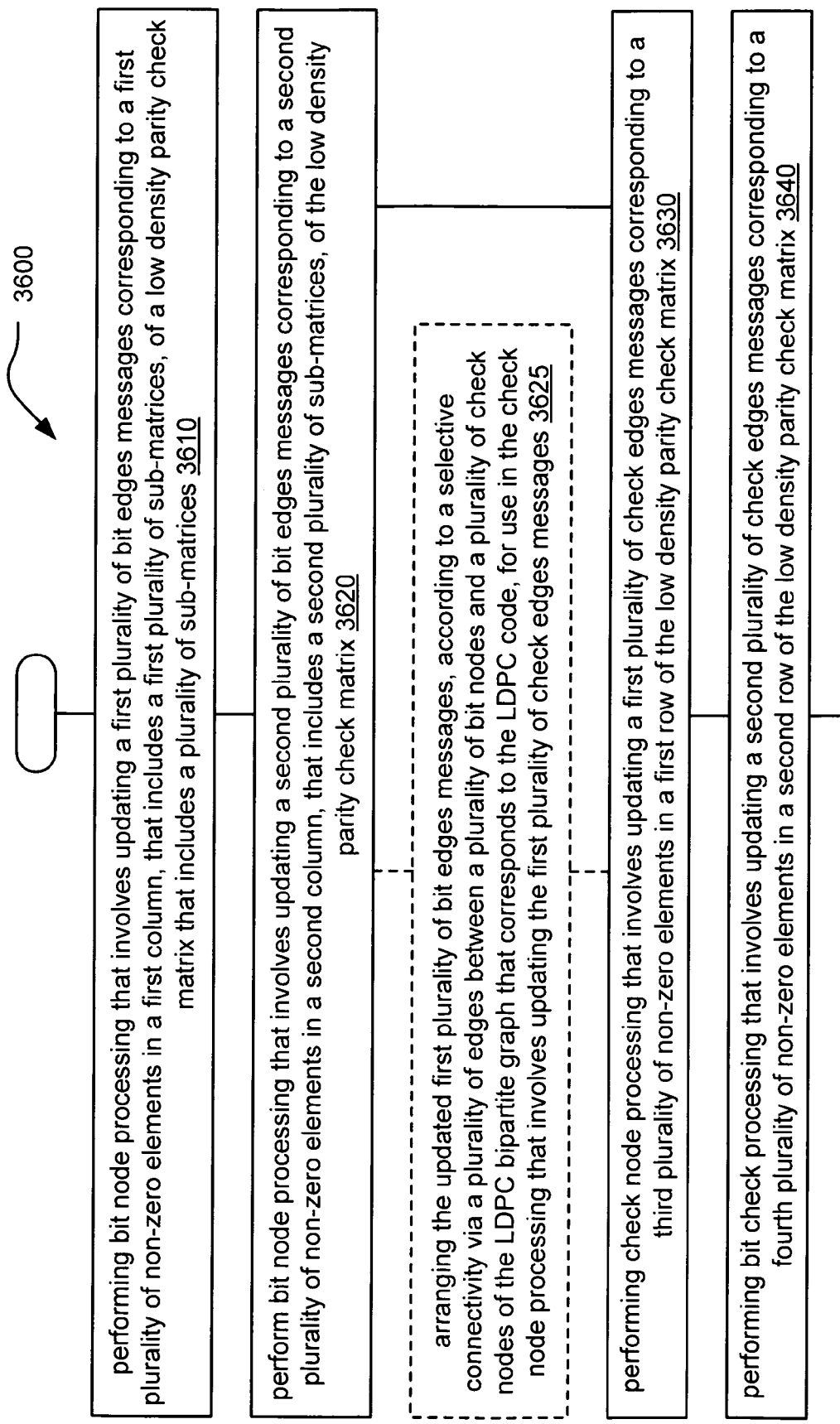

SUB-MATRIX-BASED IMPLEMENTATION OF LDPC (LOW DENSITY PARITY CHECK) DECODER

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/755,803, entitled "Sub-matrix-based implementation of LDPC (Low Density Parity Check) decoder," filed Tuesday, Jan. 3, 2006 (Jan. 3, 2006), pending.

BACKGROUND OF THE INVENTION

1. Technical Field of the Invention

The invention relates generally to communication systems; and, more particularly, it relates to decoding signals employed within such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower BER (Bit Error Rate) than alternative codes for a given SNR (Signal to Noise Ratio).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

When performing decoding processing of such LDPC signals within communication systems, a designer has quite a degree of freedom by which to implement the hardware to perform such decoding. By selecting a particular topological arrangement (in terms of hardware and processing resources) for implementing an LDPC code decoder. Depending on the particular design parameters desired to be optimized, a designer can select a particular decoder design to meet any one or more of various design objectives including meeting desired levels of area, time, and power that are required to decode such LDPC signals effectively and to an acceptable degree of performance for a given application. There seems continual to be a need in the art for more and better designs to allow a hardware device designer to select a particular arrangement to meet the particular needs of a particular application.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 32 and FIG. 33 illustrate other embodiments of bit node processing (0/1) and (1/1) when employing 2 cycles according to a semi-parallel sub-matrix approach, respectively.

FIG. 34 and FIG. 35 illustrate other embodiments of check node processing (0/1) and (1/2) when employing 2 cycles according to a semi-parallel sub-matrix approach, respectively.

FIG. 36 illustrates an embodiment of a method for performing bit node processing and check node processing.

DETAILED DESCRIPTION OF THE INVENTION

Figure 1:
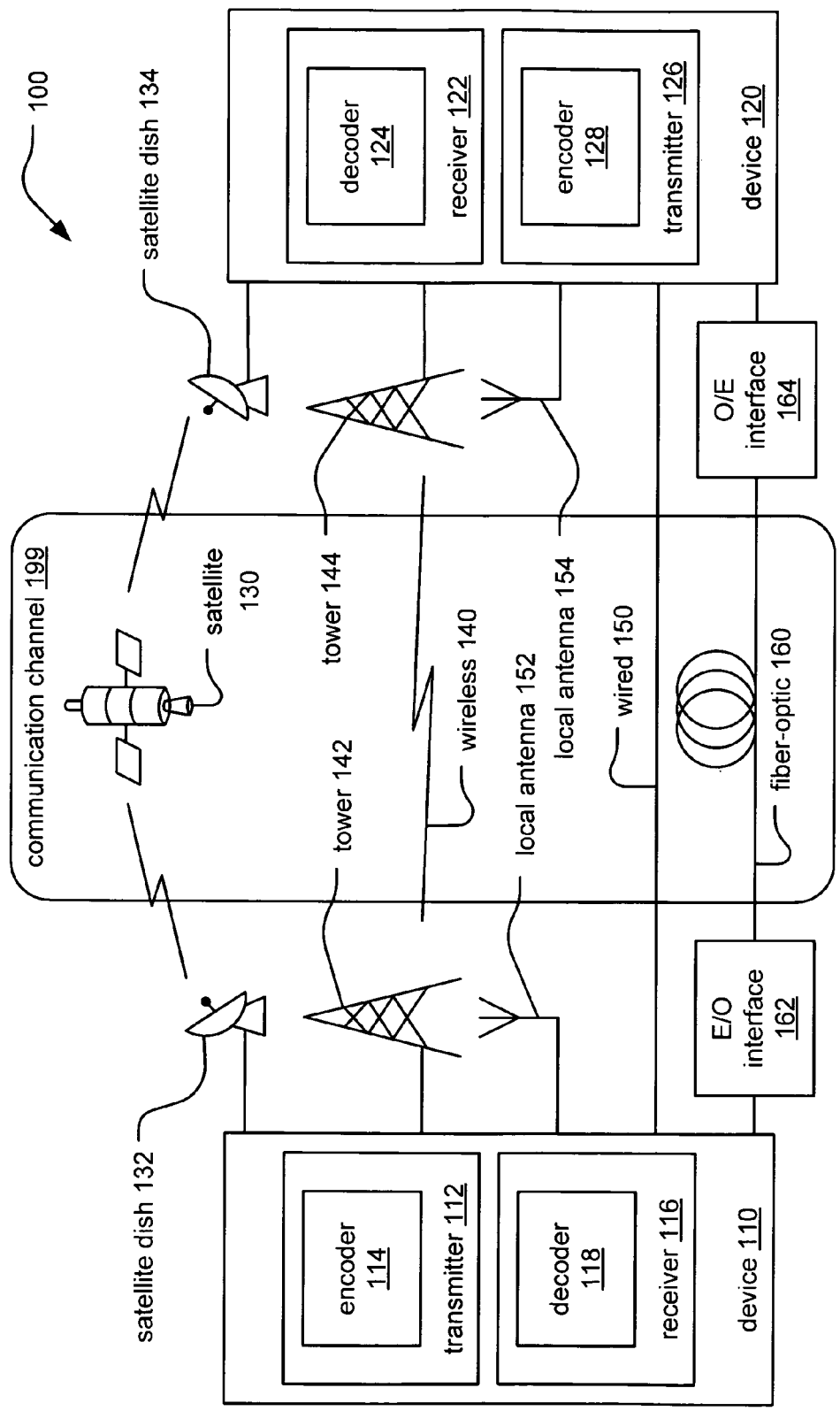
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
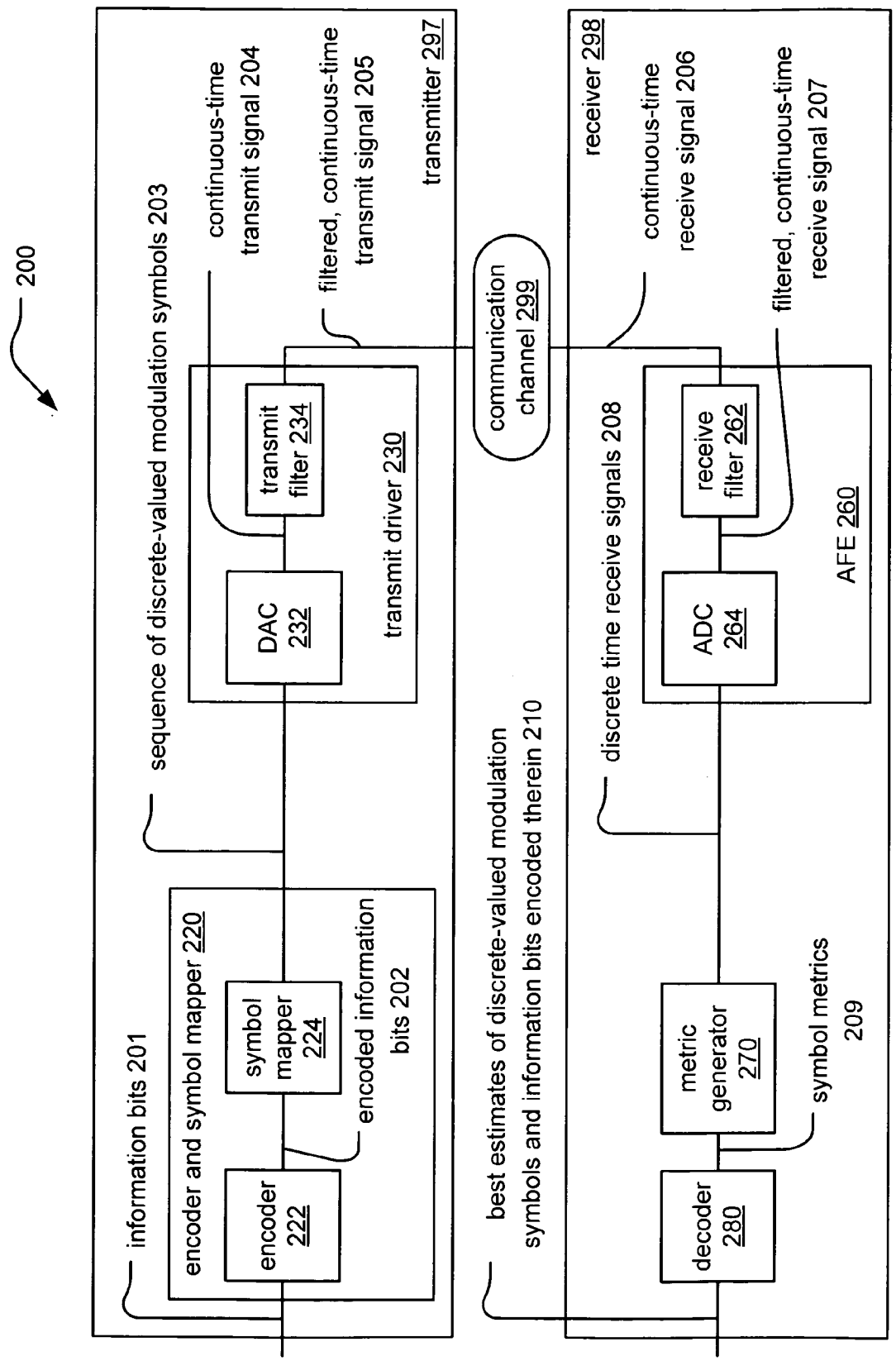

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signals. Before more details are provided below, a general description of LDPC codes is provided.

Figure 3:
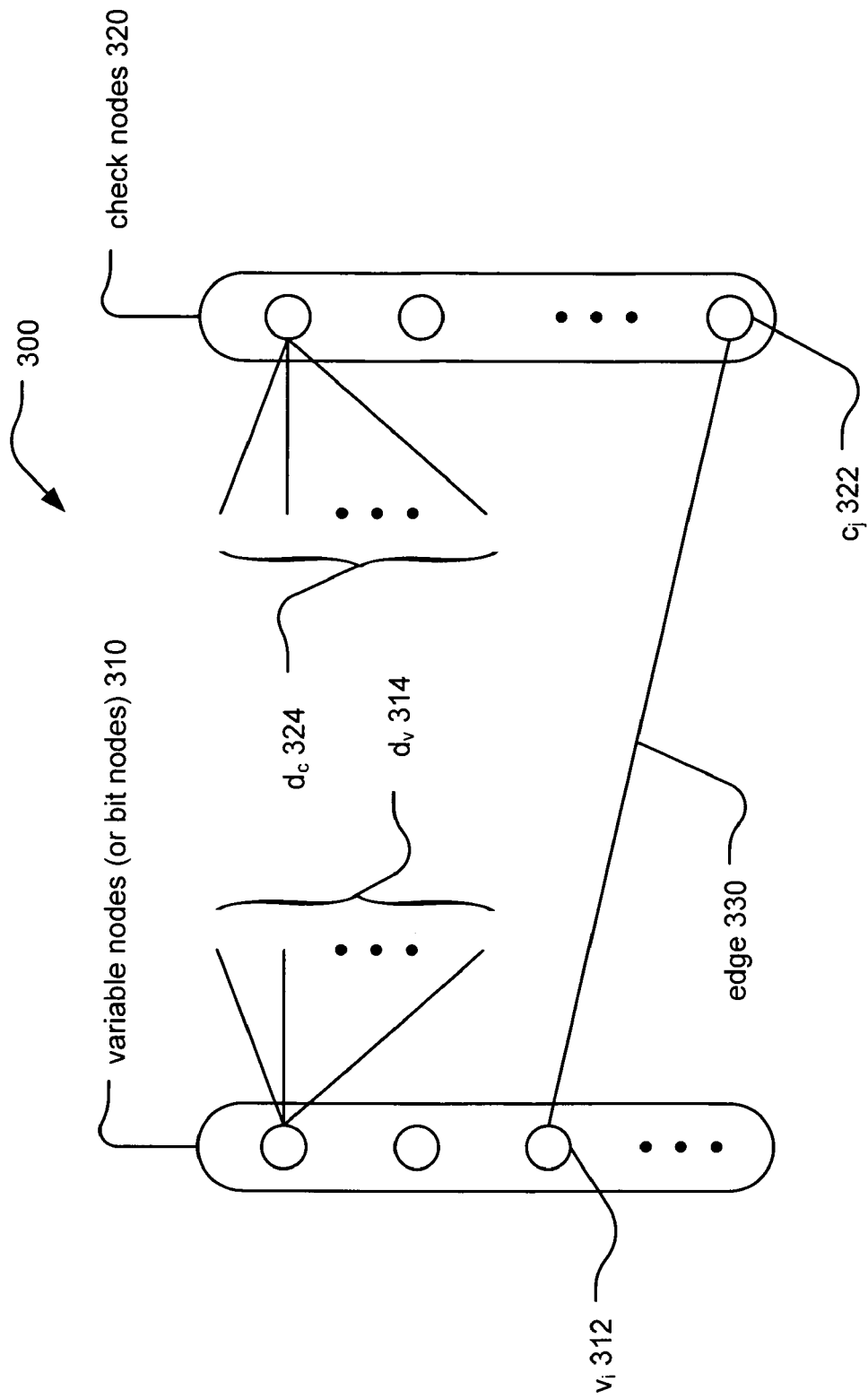
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e),c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair ($\lambda$, $\rho$) is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC.

Figure 4:
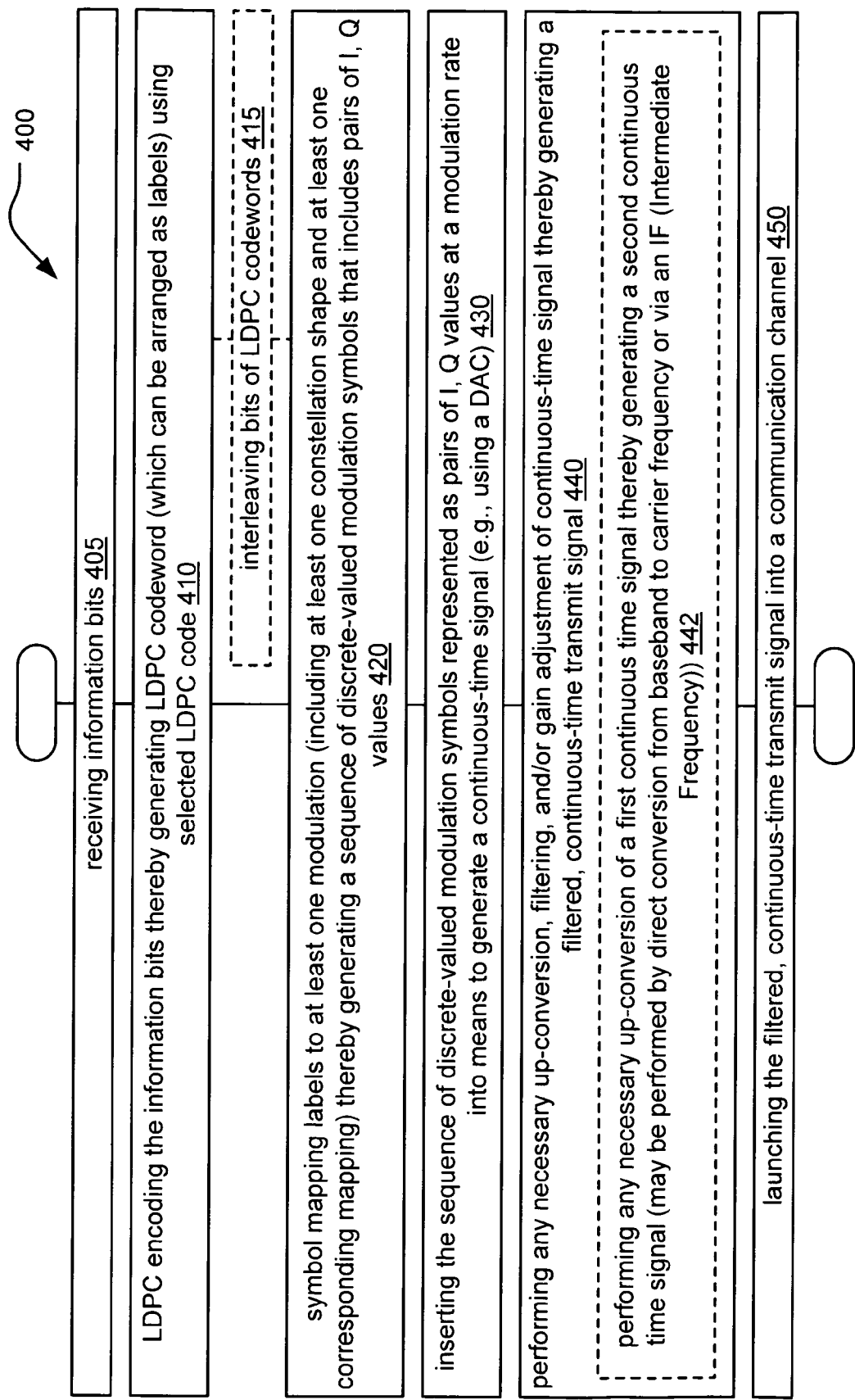
FIG. 4 illustrates an embodiment of a method for transmit processing of an LDPC coded signal.

FIG. 4 illustrates an embodiment of a method 400 for transmit processing of an LDPC coded signal. The method 400 that may be viewed as being performed at a transmitter end of a communication channel.

This method 400 also may be viewed as involving the generation of an LDPC coded signal as well as any operations to that are required to comport the LDPC coded signal to a communication channel into which a corresponding continuous-time transmit signal is to be launched.

Initially, this method 400 involves receiving information bits, as shown in a block 405. These information bits correspond to the actual information that is desired to be transmitted from one end of a communication channel to the other. At the other end, an effort to making best estimates of these original information bits is made. Continuing on, this method 400 involves LDPC encoding the information bits thereby generating an LDPC codeword (which can be arranged as labels), as shown in a block 410. For example, the LDPC codeword (or LDPC block) can be arranged to include labels that all have the same number of bits or labels of different bit sizes. This encoding may be performed using a selected LDPC code. In some instances, the method 400 may also involve interleaving the bits of a LDPC codeword after encoding them using an LDPC code, as shown in a block 415.

Then, as shown in a block 420, the method 400 then continues by symbol mapping the labels to at least one modulation (that includes at least one constellation shape and at least one corresponding mapping). In some embodiments, these labels are symbol mapped to a number of different modulation types thereby generating a variable modulation and/or code rate signal whose modulation and/or code rate may vary as frequently as on a frame by frame basis or even as frequently as on a symbol by symbol basis. This symbol mapping of the labels to at least one modulation thereby generates a sequence of discrete-valued modulation symbols that includes pairs of I, Q values (or higher dimensional constellation). At this point, the sequence of discrete-valued modulation symbols may be viewed as being an LDPC coded modulation signal (being in completely digital form at this point).

The method 400 then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method 400 may involve performing any necessary up-conversion, filtering, and/or gain adjustment of the continuous-time signal (e.g., the continuous-time baseband signal) thereby generating a filtered, continuous-time transmit signal, as shown in a block 440. There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method 500 that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). The diagram illustrated and described below shows the method 500 by which the receive processing of such a received continuous-time signal (e.g., at a receiver end of a communication channel) may be performed in an effort ultimately to make best estimates of the information bits that had been encoded therein.

Figure 5:
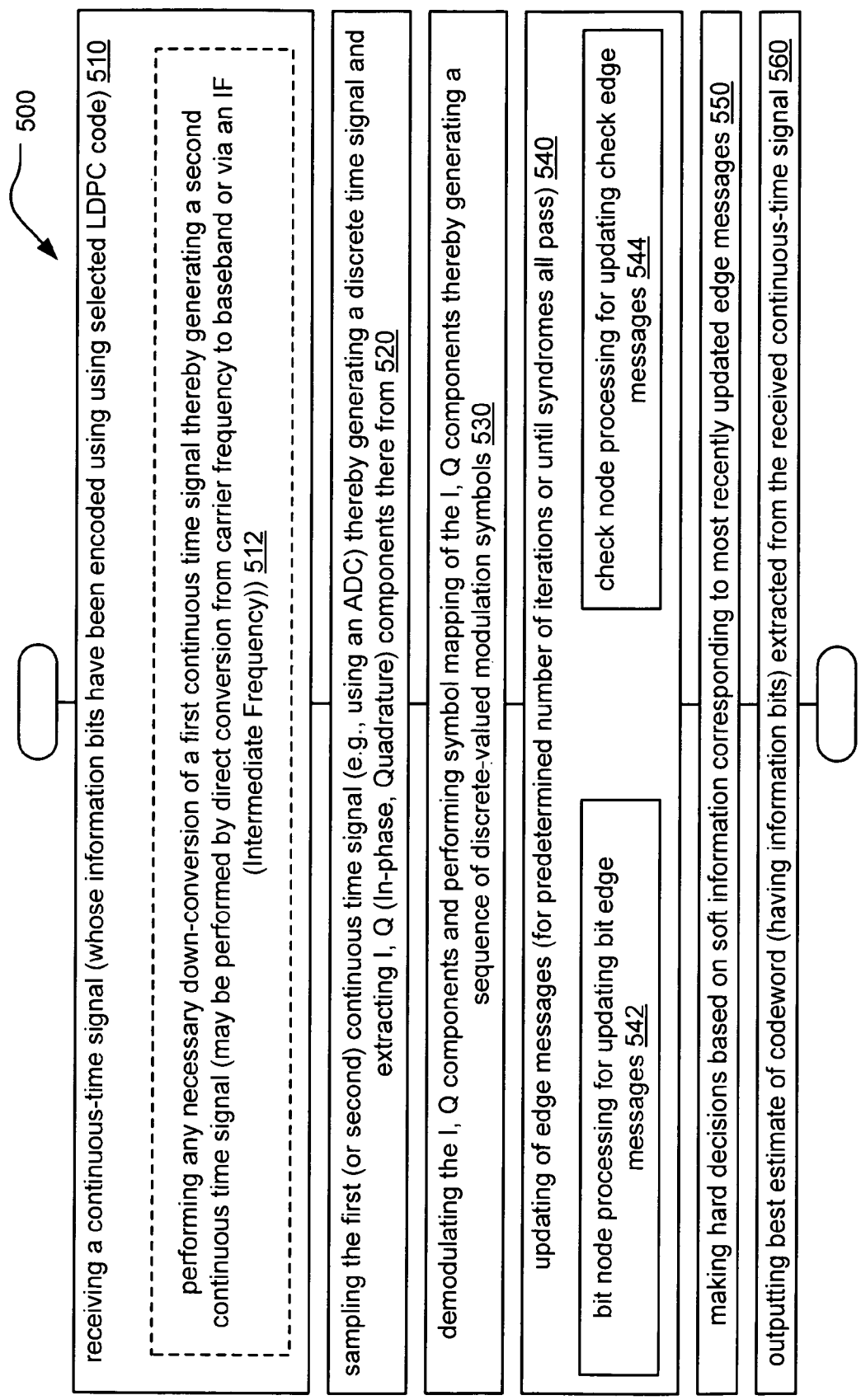
FIG. 5 illustrates an embodiment of a method for receive processing of an LDPC coded signal.

FIG. 5 illustrates an embodiment of a method 500 for receive processing of an LDPC coded signal. The method 500 initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method 500.

The method 500 also involves sampling the first (or second) continuous-time signal thereby generating a discrete time signal and extracting I, Q (In-phase, Quadrature) components there from, as shown in a block 520. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method 500 then involves demodulating the I, Q components and performing symbol mapping of the I, Q components thereby generating a sequence of discrete-valued modulation symbols, as shown in a block 530.

The next step of the method 500 of this embodiment involves performing updating of edge messages for a predetermined number of iterations, as shown in a block 540. This step may be viewed as performing the LDPC decoding in accordance with any of the various embodiments described above. This LDPC decoding generally involves bit node processing for updating bit edge messages (as shown in a block 542) as well as check node processing for updating check edge messages (as shown in a block 544).

After the final decoding iteration of the predetermined number of decoding iterations (or until all syndromes of the LDPC code are equal to zero (i.e., all syndromes pass) in an alternative embodiment), the method 500 involves making hard decisions based on soft information corresponding to most recently updated edge messages with respect to the bit nodes, as shown in a block 550. The method 500 ultimately involves outputting a best estimate of the codeword (that includes the information bits) that has been extracted from the received continuous-time signal, as shown in a block 560.

Figure 6:
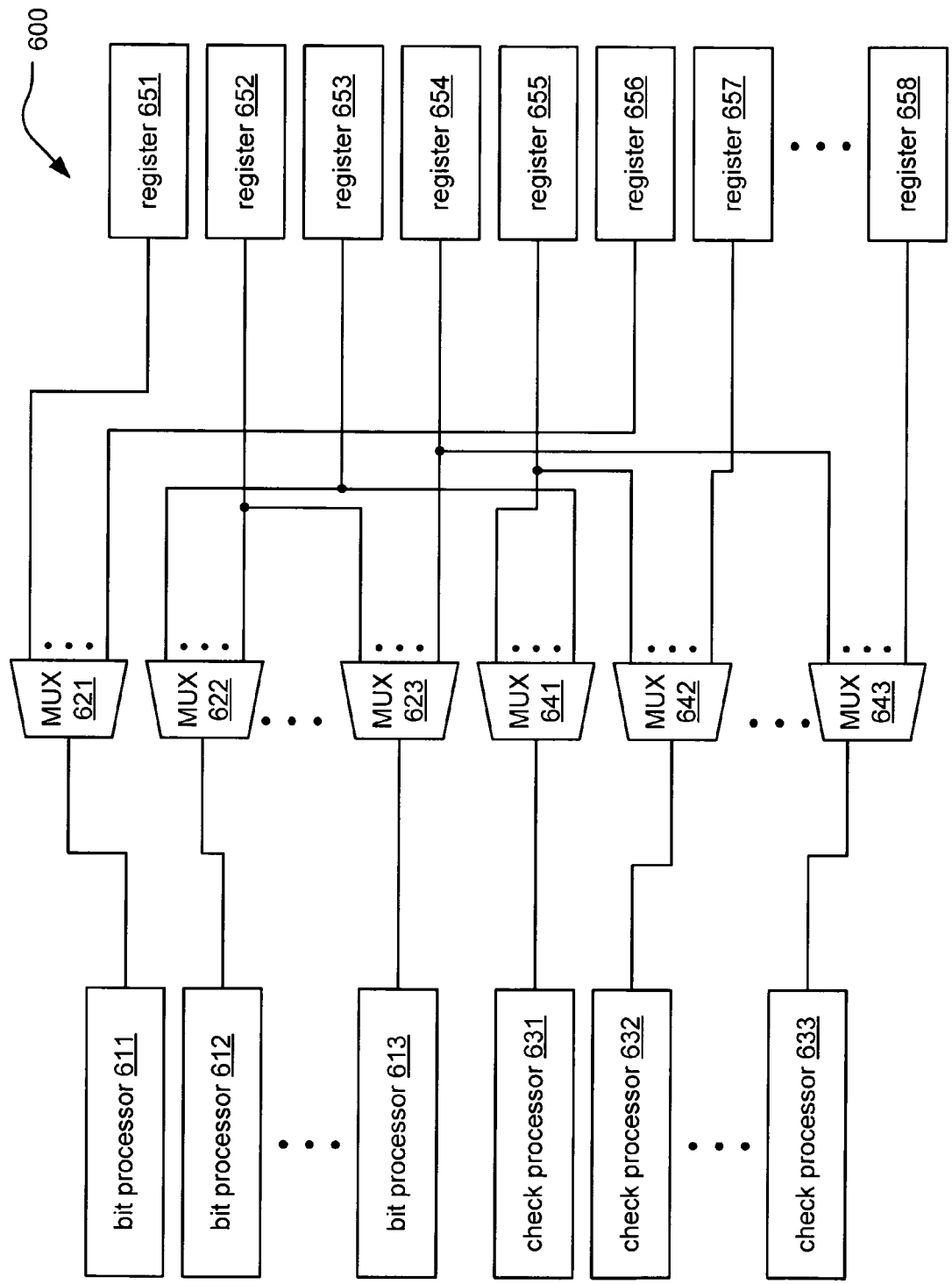
FIG. 6 illustrates an embodiment of a plurality of registers multiplexed among a plurality of bit processors and check processors.

FIG. 6 illustrates an embodiment 600 of a plurality of registers multiplexed among a plurality of bit processors and check processors. In previous designs which implement the decoding in a totally parallel setup, the number of bit nodes of the LDPC code (e.g., which can be extracted from the LDPC bipartite graph) determines the number of bit processors to be employed on a 1 to 1 basis. Similarly, in a totally parallel setup, the number of check nodes of the LDPC code (e.g., which can be extracted from the LDPC bipartite graph) determines the number of check processors to be employed on a 1 to 1 basis. Each of the bit node processing and the check node processing is therefore performed in 1 cycle each. During bit node processing, each bit processor communicates with its corresponding group of registers. During check node processing, each check processor communicates with its corresponding group of registers.

In such a totally parallel setup, the totally number of bit processor and check processors can be very large. In some designs, this large consumption of space and processing resources in a device is undesirable and/or extremely expensive in terms of cost and/or real estate consumption.

In contradistinction, the embodiment 600 shows how a reduced number of both bit processors and check processors can be employed to reduce significantly the amount of real estate to be consumed with these processing resources. A plurality of multiplexors (MUXes) is employed selectively to communicatively couple each of a plurality of bit processors (or a subset thereof) or a plurality of check processors (or a subset thereof) to a plurality of registers that is employed to perform management of the edge messages (i.e., bit edge messages and check edge messages) that are updated and employed when performing iterative decoding of an LDPC coded signal.

With reference to FIG. 6, a plurality of bit processors is shown as bit processor 611, bit processor 612, . . . , and bit processor 613. Each bit processor is communicatively coupled to a MUX that allows the selective communicative coupling to one or more of a plurality of registers (shown as register 651, register 652, register 653, register 654, register 655, register 656, register 657, . . . , register 659). Looking at some specific examples, the bit processor 611 communicatively couples to MUX 621 which allows for selective communicative coupling to at least register 651 and 656, as well as any other registers as desired in the particular implementation.

The bit processor 612 communicatively couples to MUX 622 which allows for selective communicative coupling to at least register 653 and 653, as well as any other registers as desired in the particular implementation. The bit processor 613 communicatively couples to MUX 623 which allows for selective communicative coupling to at least register 652 and 654, as well as any other registers as desired in the particular implementation.

The check processor 631 communicatively couples to MUX 641 which allows for selective communicative coupling to at least register 655 and 653, as well as any other registers as desired in the particular implementation. The check processor 632 communicatively couples to MUX 642 which allows for selective communicative coupling to at least register 655 and 657, as well as any other registers as desired in the particular implementation. The check processor 633 communicatively couples to MUX 643 which allows for selective communicative coupling to at least register 654 and 658, as well as any other registers as desired in the particular implementation.

Clearly, the number of each of bit processors, check processors, MUXes, and registers can be selected as desired for a particular application. When selecting the numbers and arrangement of such resources, a designer is provided the ability to make trade offs within a design. For example, when a fewer number of processors is employed (for each of bit processors and check processors), then a larger number of cycles needs to be performed when performing either bit node processing or check node processing. The fewer number of processors employed will reduce the amount of real estate consumed within the device and can provide for a lower cost, but the processing time will take longer by requiring more cycles for each of bit node processing and check node processing. Also, the memory management and connectivity required to connect bit processors, check processors, MUXes, and registers within an actual device should be considered, as this also consumes a certain degree of real estate and incurs a certain complexity and cost.

However, this design approach can be customized to a given application relatively easily by a designer. A designer can find the "sweet spot" in terms of selecting the appropriate amount of each of these resources (bit processors, check processors, MUXes, and registers) to meet his design objectives. For some designs, a reduced processing time is paramount and could lead to a semi-parallel design approach for each of the bit node processing and check node processing. Alternatively, in other designs, a reduced real estate (and/or reduced cost) is paramount, and a relatively fewer number of each of the bit processors and check processors is desirable.

Figure 7:
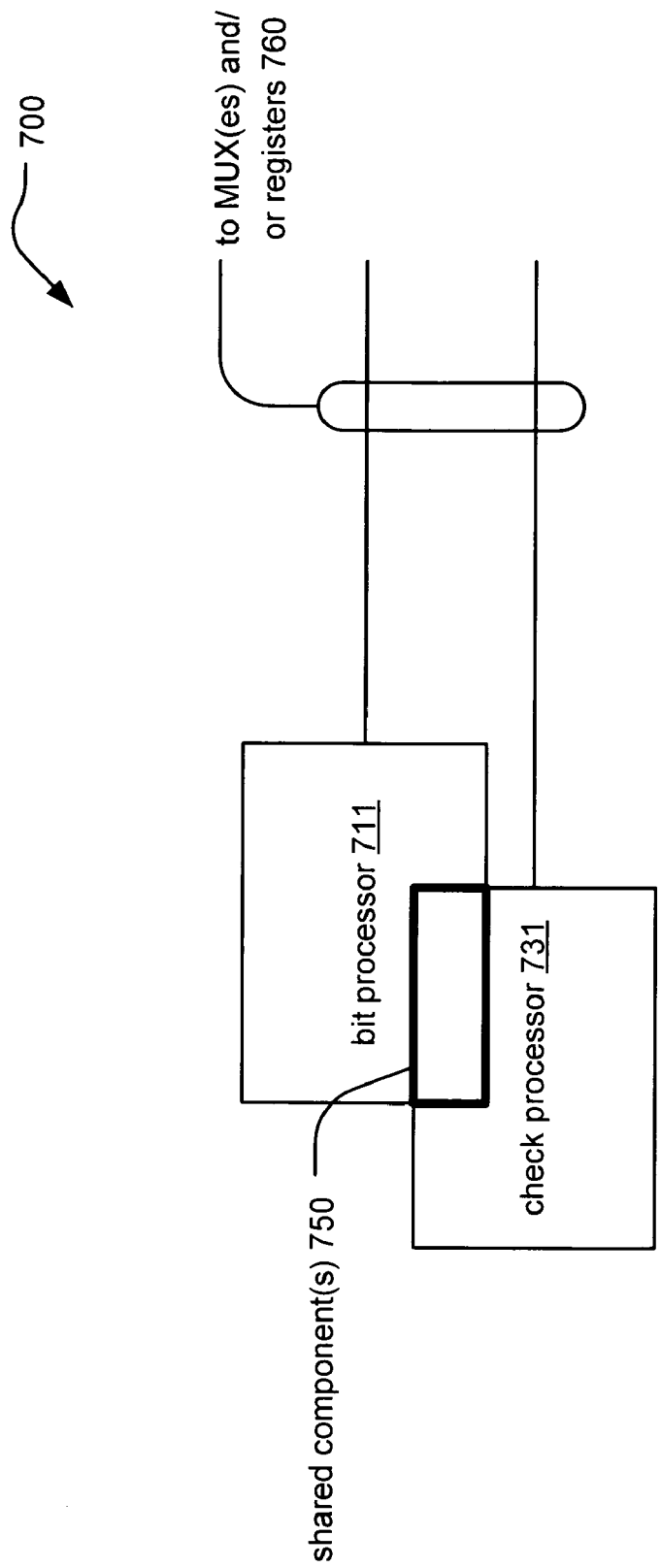
FIG. 7 illustrates an embodiment of a bit processor and a check processor such that at least one common component is employed by each.

FIG. 7 illustrates an embodiment 700 of a bit processor 711 and a check processor 731 such that at least one common component (shown by shared component(s) 750) is employed by each. Each of the bit processor 711 and a check processor 731 communicatively couples to a MUX and/or registers as shown by the lines 760.

This diagram shows how certain components may be shared and used when performing both bit node processing and check node processing by a bit processor 711 and a check processor 731, respectively. This efficiency in terms of reusing certain components can result in a reduction in complexity and a reduction in size (thanks to the re-use of components).

In some instances, each of the bit node processing and check node processing performs at least one similar calculation, and the functionality employed to perform this calculation can then be employed by each of the bit processor 711 and the check processor 731. For example, the shared component(s) 750 can be as simple as a single shared adder, subtractor, and/or other mathematical calculation functional block that is employed by each of the bit processor 711 and the check processor 731, respectively, when performing bit node processing and check node processing.

These examples show just some possible means by which certain components may be shared and used when performing both bit node processing and check node processing within the bit processor 711 and the check processor 731 that are implemented to perform bit node processing and check node processing. Clearly, other optimizations of shared components may also be performed to conserve device size and reduce complexity without departing from the scope and spirit of the invention.

Figure 8:
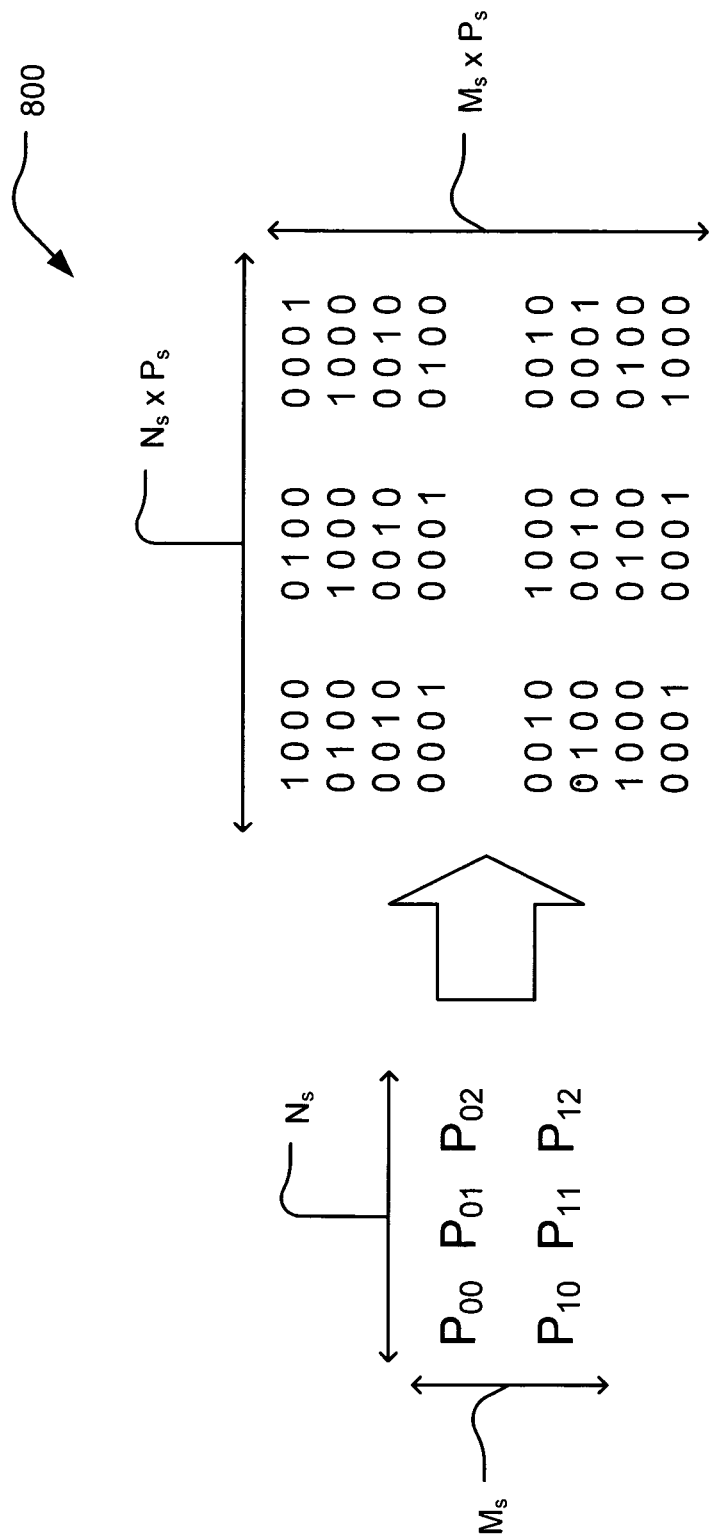
FIG. 8 illustrates an embodiment of a low density parity check matrix, H.

FIG. 8 illustrates an embodiment 800 of a low density parity check matrix, H. Several embodiments are depicted below with reference to the general structure of this low density parity check matrix, H. A low density parity check matrix, H, can be extracted from an LDPC bipartite graph (e.g., the one depicted in FIG. 3). It is noted that the low density parity check matrix, H, can correspond to a regular LDPC code or an irregular LDPC code in various embodiments.

It is noted, in the case of processing irregular LDPC codes, that the number of edges being processed per cycle may not always be the same. For example, one way to transform a regular LDPC code to an irregular LDPC code is to puncture or eliminate some of the non-zero entries therein. In such a case, a regular LDPC code can be considered in which n edges are processed each cycle in a given decoding approach (many embodiments of which are described in more detail below). For example, in one situation, x cycles are performed when processing a regular LDPC code, and n edges are processed in each cycle. If the low density parity check matrix corresponding to this regular LDPC code is modified by puncturing one of the "1"s (e.g., non-zero elements) in the upper left hand corner, for example, then only n−1 edges would be processed in the first cycle, and n edges would be processed in the second and subsequent cycles. Depending on the number of pluralities of bit edge messages and check edge messages into which the total number of bit edge messages and check edge messages are partitioned, respectively, the number of edges being processed in each cycle may be slightly different when processing irregular LDPC codes. The same analysis provided above can also be applied to even more parallel approaches without departing from the scope and spirit of the invention when dealing with irregular LDPC codes, in that, different numbers of edges may be processed during different cycles.

Looking at the left hand side of this diagram, it can be seen that the low density parity check matrix, H, is composed of a plurality of permutation matrices, depicted by $P_{00}$, $P_{01}$, $P_{02}$, $P_{10}$, $P_{11}$, and $P_{12}$. The number of columns of permutation matrices of the low density parity check matrix, H, is shown as being $N_s$, and number of rows of permutation matrices of the low density parity check matrix, H, is shown as being $M_s$. $P_s$ is the order the permutation matrix that is used to generate the sub-matrices of the low density parity check matrix, H. $N=N_s \times P_s$ is the number of bits of the LDPC code, and $M=M_s \times P_s$ is the number of rules (or check) that these bits have to satisfy for proper error correction decoding. The total number of edges of the LDPC bipartite graph, that selectively connect the bit nodes to the check nodes, is $N_s \times M_s \times P_s$.

Looking at the right hand side of this diagram, it can be seen that the number of columns of the low density parity check matrix, H, is shown as being $N=N_s \times P_s$. The number of rows of the low density parity check matrix, H, is shown as being $M=M_s \times P_s$.

Clearly, other forms of his low density parity check matrices, H, can be employed as well without departing from the scope and spirit of the invention. This particular low density parity check matrix, H, is employed for illustration with reference to some possible embodiments described below. For another low density parity check matrix, H, other appropriate partial parallel designs can also be achieved using a similar design approach as the one presented here.

Various embodiments are presented below by which the decoding processing of an LDPC coded signal can be performed by various sub-matrix-based implementations and methods. The low density parity check matrix, H, is partitioned into a plurality of sub-matrices, and these sub-matrices are processed using any one or combination of the various sub-matrix-based approaches presented below.

Several of the embodiments presented below are illustrated and described using a low density parity check matrix, H, that is composed of a plurality of permutation matrices as follows.

H=[[$P_{00}$, $P_{01}$, $P_{02}$, $P_{03}$, $P_{04}$, $P_{05}$], [$P_{10}$, $P_{11}$, $P_{12}$, $P_{13}$, $P_{14}$, $P_{15}$]]

This low density parity check matrix, H, is provided in many of the various diagrams as well to assist the reader in understanding which portions of the low density parity check matrix, H, are being processing during various steps of both bit node processing and check node processing.

This particular low density parity check matrix, H, includes $N_s=6$, and $M_s=2$. In other words, the low density parity check matrix, H, includes 6 columns of sub-matrices and 2 rows of sub-matrices. More specifically, each of the sub-matrices in this particular low density parity check matrix, H, is a 4×4 sub-matrix (i.e., $P_s=4$). Therefore, it can be seen that the number of columns of the low density parity check matrix, H, is shown as being $N_s \times P_s = 6 \times 4 = 24$. The number of rows of the low density parity check matrix, H, is shown as being $M_s \times P_s = 2 \times 4 = 8$.

It is of course noted that while this particular low density parity check matrix, H, is used for illustration and to assist the reader to comprehend the various embodiments described herein, clearly any other sized low density parity check matrix, H, could also be employed without departing from the scope and spirit of the invention.

Figure 9:
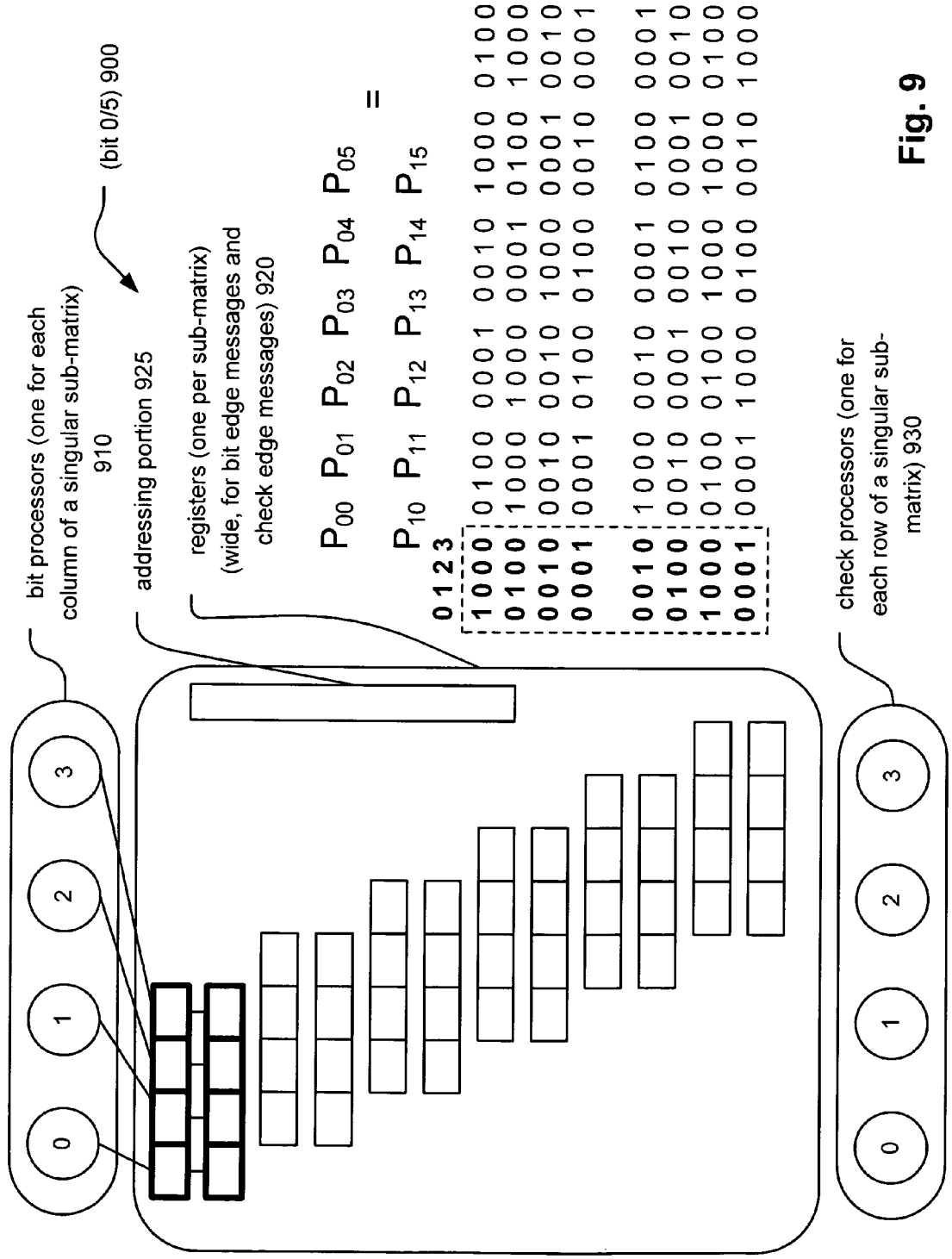
FIG. 9 and FIG. 10 illustrate embodiments of bit node processing (0/5) and (1/5) when employing 6 cycles, respectively.
Figure 10:
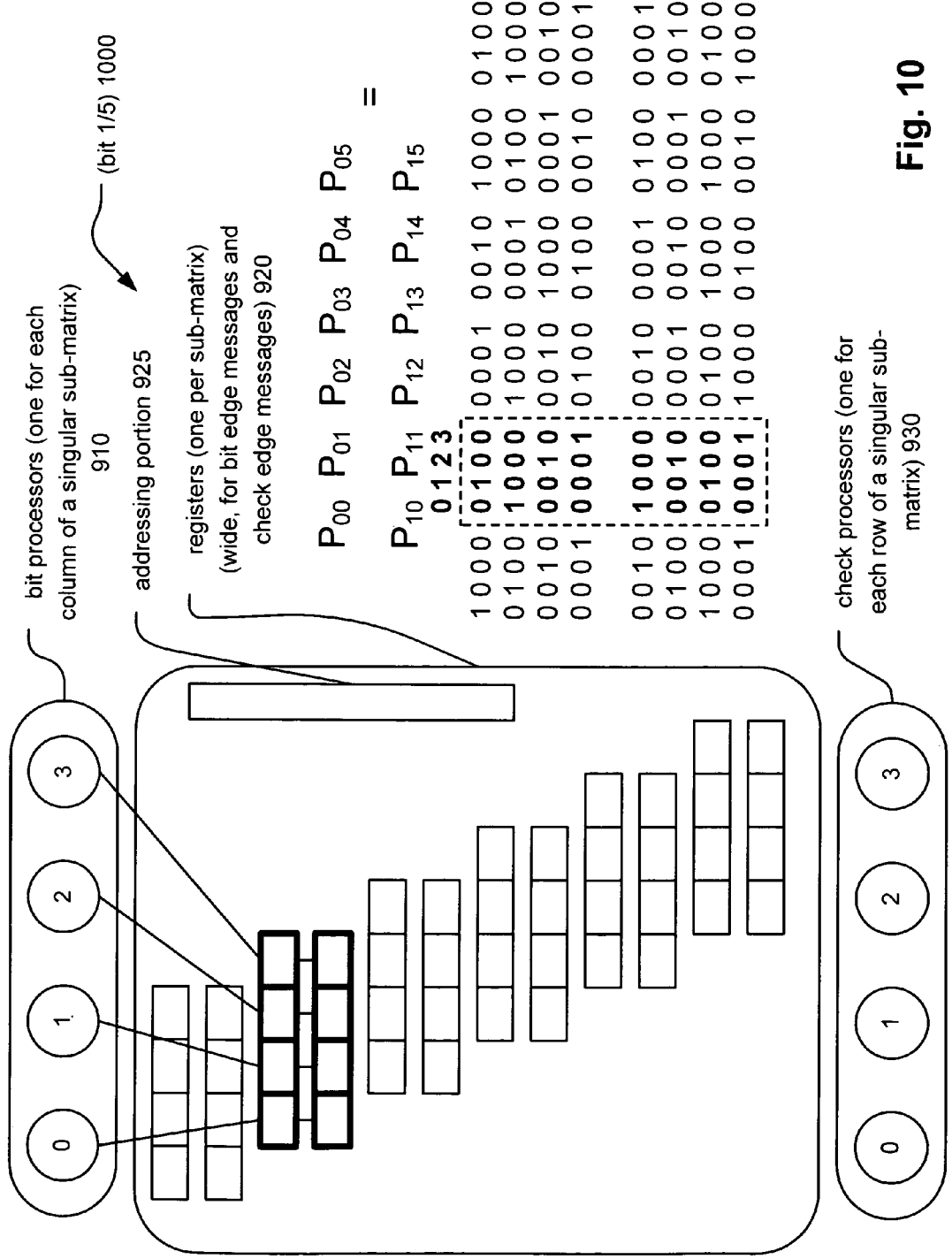

FIG. 9 and FIG. 10 illustrate embodiments 900 and 1000 of bit node processing (0/5) and (1/5) when employing 6 cycles, respectively.

In total, 6 cycles are required to perform this approach to bit node processing. The total number of bit processors 910 corresponds to the number of columns in each of the individual sub-matrices of the low density parity check matrix, H, of the LDPC code. For example, this embodiment shows that the sub-matrices each include 4 columns, so 4 bit processors 910 are shown. However, for a low density parity check matrix, H, having larger (or smaller) sized sub-matrices having a different number of columns, the number of bit processors 910 could be adjusted accordingly.

The embodiments 900 and 1000 show the cycles 0 and 1 of a total number of 6 cycles (i.e., 0, 1, 2, 3, 4, and 5). Also, the embodiments 900 and 1000 employ a total number of check processors 930 that corresponds to the number of rows in each of the individual sub-matrices of the low density parity check matrix, H, of the LDPC code. For example, this embodiment shows that the sub-matrices each include 4 rows, so 4 check processors 930 are shown. However, for a low density parity check matrix, H, having larger (or smaller) sized sub-matrices having a different number of rows, the number of check processors 930 could also be adjusted accordingly (just as the number of bit processors 910 could be adjusted, as described above).

It is noted that the total number of bit nodes and the total number of check nodes can be deduced from the LDPC bipartite graph representative of the LDPC code. This graph also depicts the selective connectivity of the edges between certain of the bit nodes and the check nodes. When performing bit node processing, the bit edge messages for the corresponding bit nodes are calculated/updated. When performing check node processing, the check edge messages for the corresponding check nodes are calculated/updated.

In addition, a plurality of registers 920 is employed to store the bit edge messages and the check edge messages when performing bit node processing and check node processing. The total number of registers 920 employed can be selected to correspond to the number of sub-matrices into which the low density parity check matrix, H, is partitioned. For example, this embodiment shows a low density parity check matrix, H, that is composed of a plurality of permutation matrices, depicted by $P_{00}, P_{01}, P_{02}, P_{03}, P_{04}, P_{05}, P_{10}, P_{11}, P_{12}, P_{13}, P_{14}$, and $P_{15}$. The number of columns of permutation matrices of the low density parity check matrix, H, is shown as being $N_s = 6$, and number of rows of permutation matrices of the low density parity check matrix, H, is shown as being $M_s = 2$. Therefore, in this embodiment, the total number of registers 920 corresponds to the total number of sub-matrices: $N_s \times M_s = 6 \times 2 = 12$.

The plurality of registers 920 is employed store the edge messages (i.e., bit edge messages updated during bit node processing, and the check edge messages updated during check node processing).

As mentioned above, in this embodiment, $N_s$ cycles are performed during each bit node processing step, and each bit processor communicates with $M_s$ registers in the embodiment depicted. In this particular embodiment, $N_s = 6$ cycles are performed during each bit node processing step, and each bit processor communicates with $M_s = 2$ registers in the embodiment depicted. Each bit processor is selectively capable to be communicatively coupled to $M_s$ registers, this selective communicative coupling can be achieved using MUXes as described above with reference to another embodiment. Each bit processor communicatively couples with $M_s$ of the registers 920 during any one cycle; each bit processor can be capable to connect to $N_s \times M_s$ registers. If the MUX approach is desired, then the total number of $N_s$ to 1 MUXes required is $(P_s \times M_s)$. The total number of edges that is processed per cycle is $(P_s \times M_s)$.

Looking at more detail of the processing through the low density parity check matrix, H, during the cycle (0/5), the left hand most column undergoes bit node processing. Referring to embodiment 1000 of the FIG. 10 during the cycle (1/5), the next column to the right undergoes bit node processing; this process continues processing through all of the columns as defined according to the sub-matrices into which the low density parity check matrix, H, is partitioned. That it to say, each of the columns of sub-matrices of the low density parity check matrix, H, undergo bit node processing successively until all of the low density parity check matrix, H, has undergone bit node processing.

Figure 11:
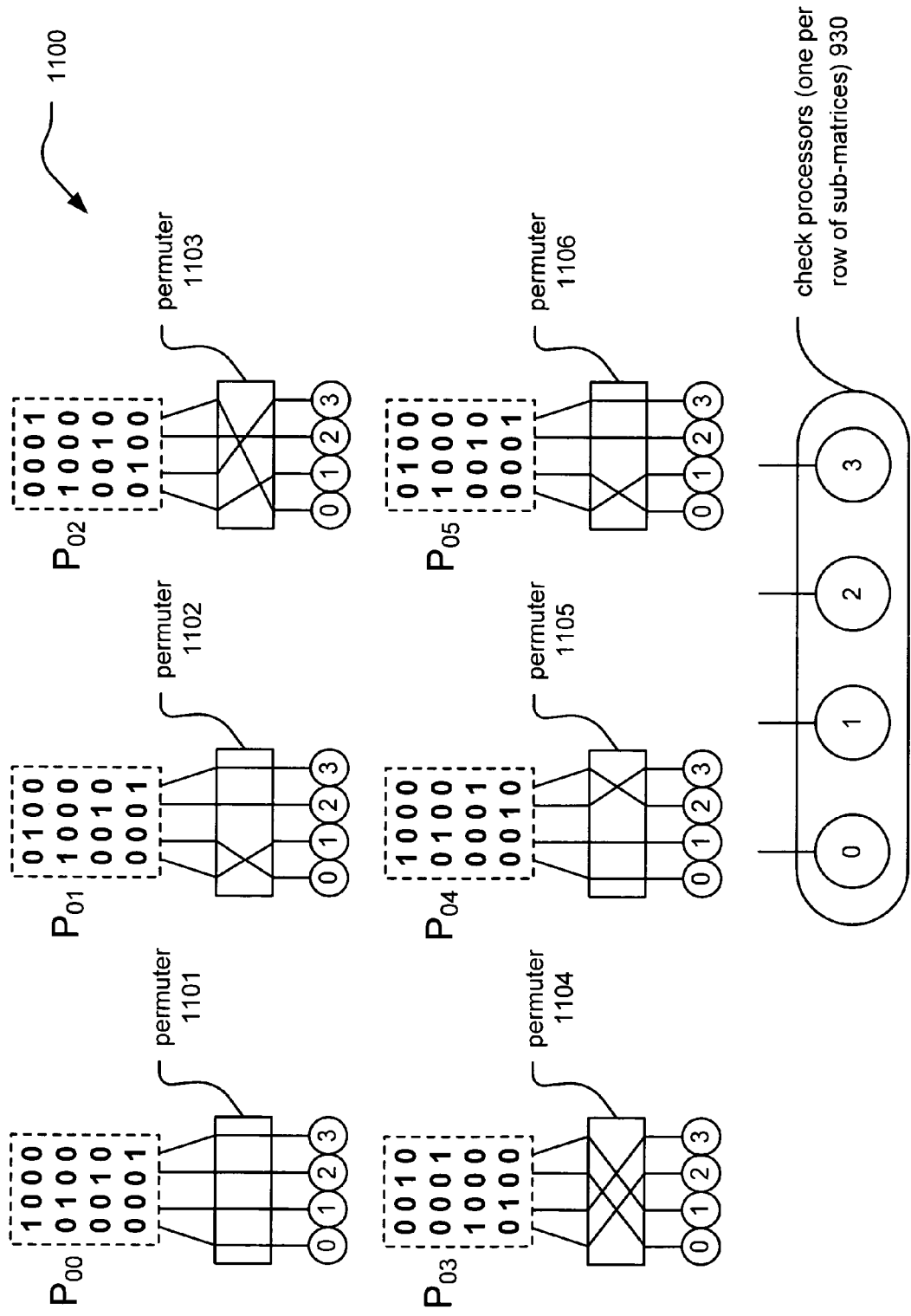
FIG. 11 illustrates an embodiment of permuting employing before check node processing.

FIG. 11 illustrates an embodiment 1100 of permuting employing before check node processing. In this particular embodiment, the bit edge messages (after being updated) during bit node processing, are re-ordered or permuted using a permuter so that they are in the appropriate order for check node processing. If desired, the alternative could be performed, in that, the check edge message order could be maintained and the check edge messages (after being updated) during check node processing could then be re-ordered or permuted using a permuter so that they are in the appropriate order for bit node processing. In the embodiment as described below, the bit edge message order is maintained, but it is clear that the converse could be performed without departing from the scope and spirit of the invention (i.e., check edge message order maintained).

In FIG. 11, only the sub-matrices in the top row of the low density parity check matrix, H, shown in the FIG. 9 and FIG. 10 is shown as undergoing permuting using a plurality of permuters. These sub-matrices are as follows: $P_{00}, P_{01}, P_{02}, P_{03}, P_{04},$ and $P_{05}$. However, the same principles shown here can also be applied to perform the appropriate permuting of the sub-matrices in the lower row as well. It is also noted that if an alternative embodiment is implemented, in which the check edge message order is maintained, then the sub-matrices in each of the columns of the low density parity check matrix, H, would undergo permuting before performing bit node processing.

In general, each of the sub-matrices of the low density parity check matrix, H, undergo the appropriate permuting so that they are aligned into a form comporting with the identity matrix, I. In those instances where a particular sub-matrix of the low density parity check matrix, H, is already in this format (i.e., already the identity matrix, I), then no permuting need be performed. In some instances, each of the permuters employed are adjustable, in that, they are capable to perform at least 2 different permutations.

Looking at the specific embodiments shown in the FIG. 11, the sub-matrix, $P_{00}$, is already in the format of the identity matrix, I. Therefore, a permuter 1101 can be viewed as being merely a pass through device. The sub-matrix, $P_{01}$, has its two left hand columns out of order with respect to the identity matrix, I, so a permuter 1102 is operable to permute those two columns before the bit edge messages are provided to the check processors 930.

The sub-matrix, $P_{03}$, has its three of its columns out of order with respect to the identity matrix, I, so a permuter 1103 is operable to permute those three columns before the bit edge messages are provided to the check processors 930. Each of permuter 1104, 1105, and 1106 is also operable to perform the appropriate permuting of each of the sub-matrices $P_{03}$, $P_{04}$, and $P_{05}$ before the corresponding bit edge messages are provided to the check processors 930, as can be seen in FIG. 11.

A designer is provided a great deal of latitude by which to implement the permuters. For example, these permuters can be stand alone devices that are implemented in between the registers 920 and the check processors 920.

Generally speaking, a particular design often ensures that the edge messages are in a "bit friendly" order or a "check friendly" order. In other words, if the edge messages are in a "bit friendly" order, the bit node processing can be performed without realigning the edge messages, but the edge messages must be appropriately aligned for check node processing. Alternatively, if the edge messages are in a "check friendly" order, the check node processing can be performed without realigning the edge messages, but the edge messages must be appropriately aligned for bit node processing.

Figure 12:
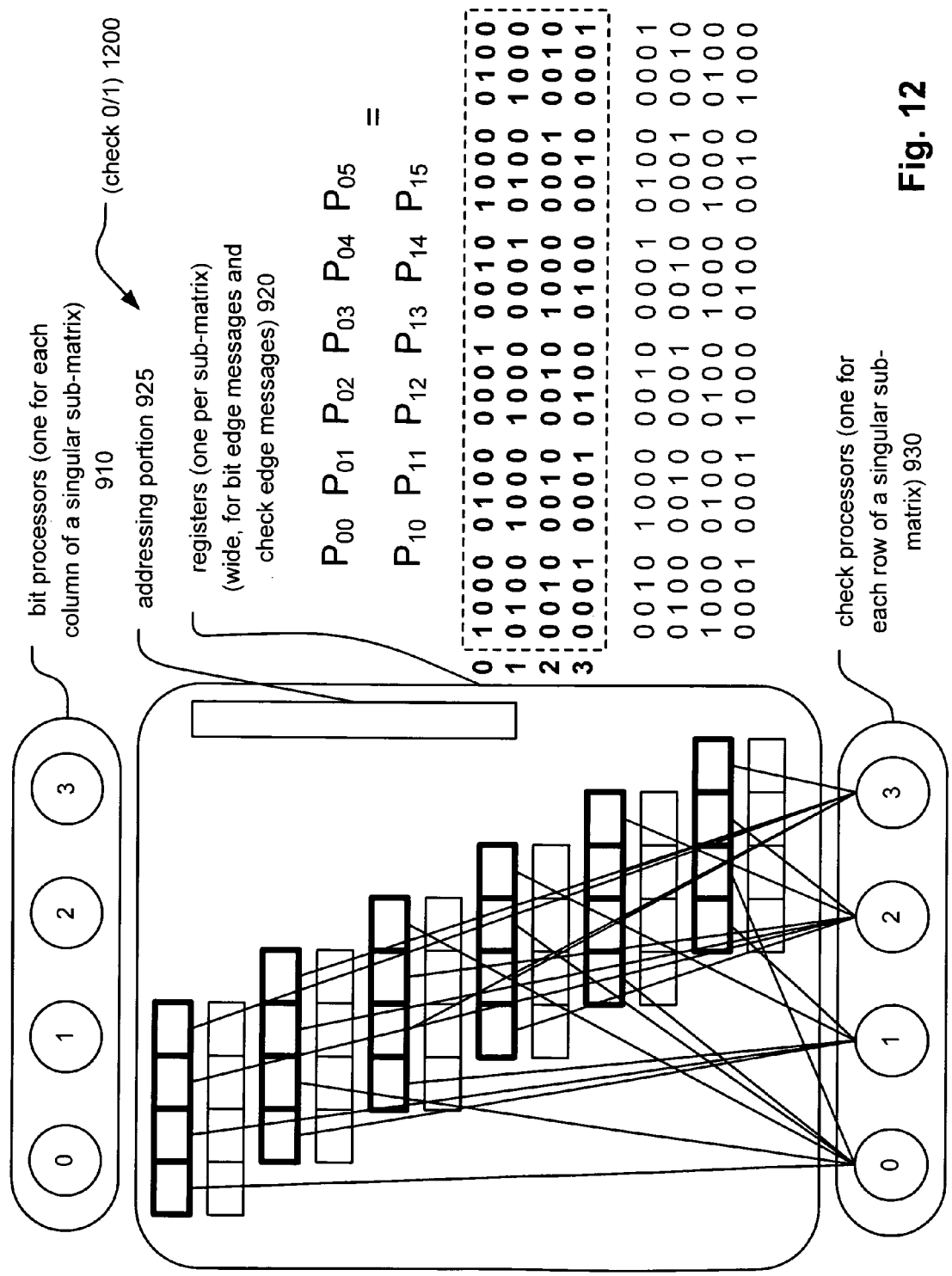
FIG. 12 and FIG. 13 illustrate embodiments of check node processing (0/1) and (1/2) when employing 2 cycles, respectively.
Figure 13:
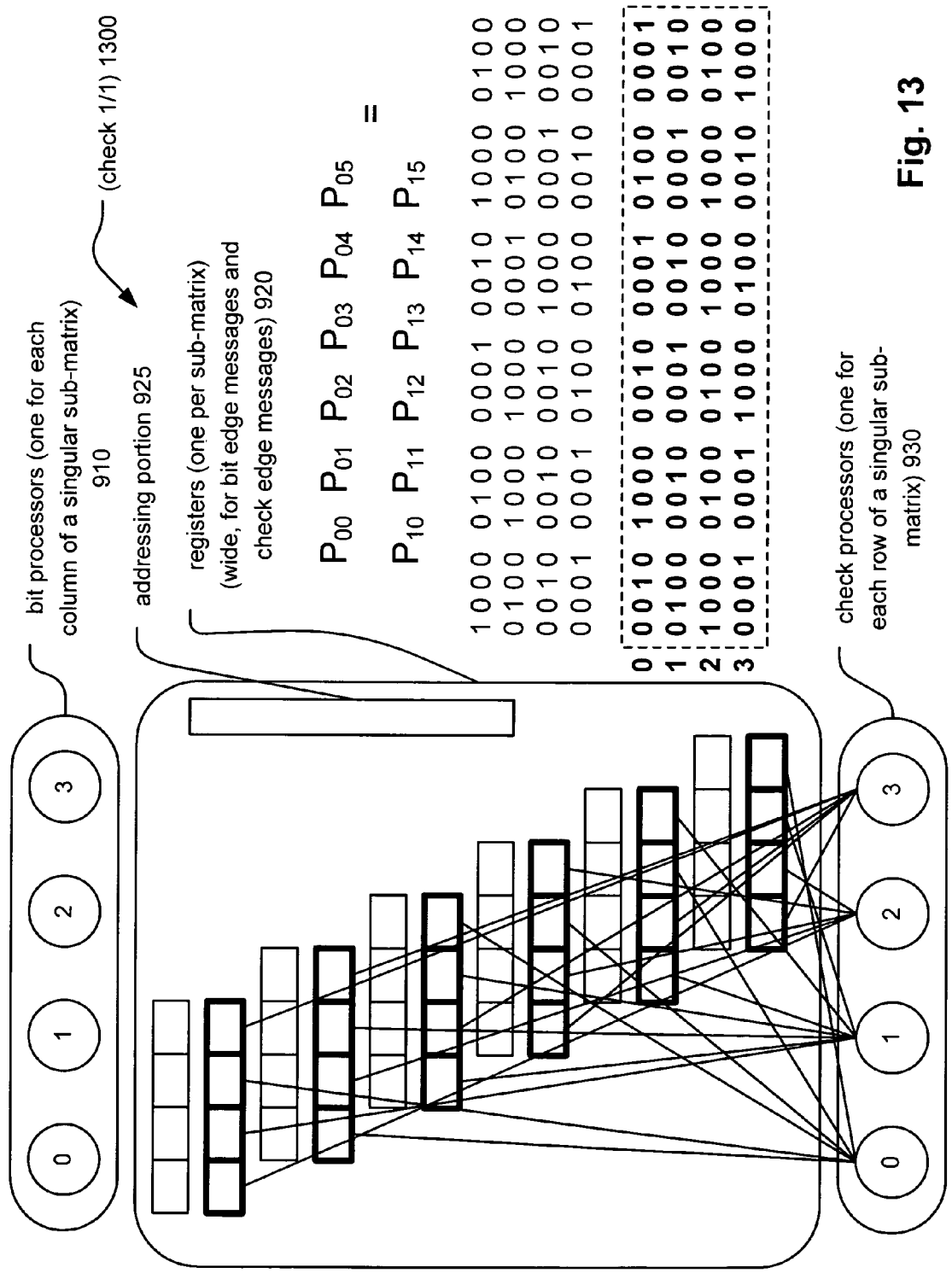
Figure 14:
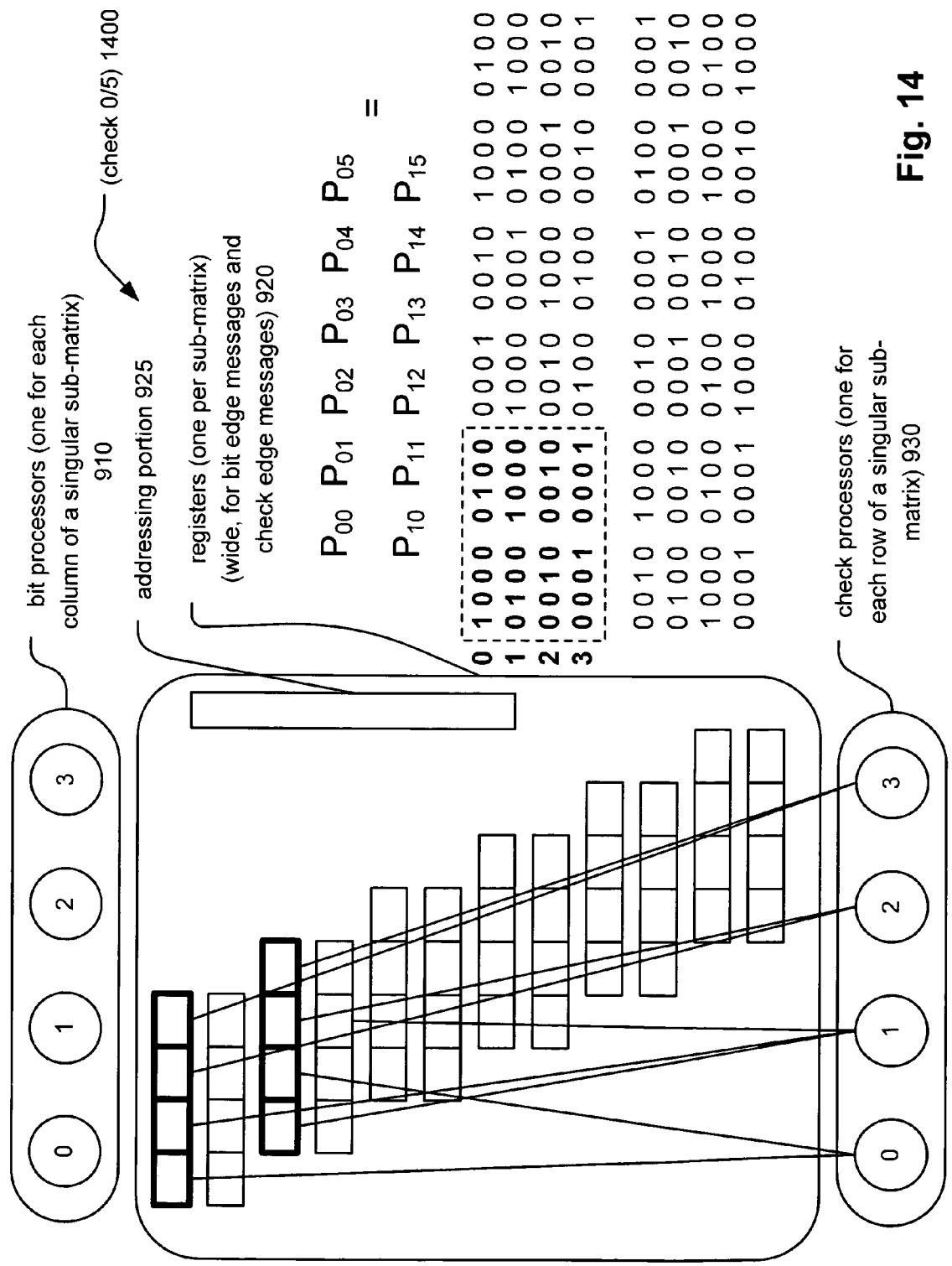
FIG. 14, FIG. 15, FIG. 16, and FIG. 17 illustrate embodiments of check node processing (0/5), (1/5), (2/5), and (3/5) when employing 6 cycles, respectively.
Figure 15:
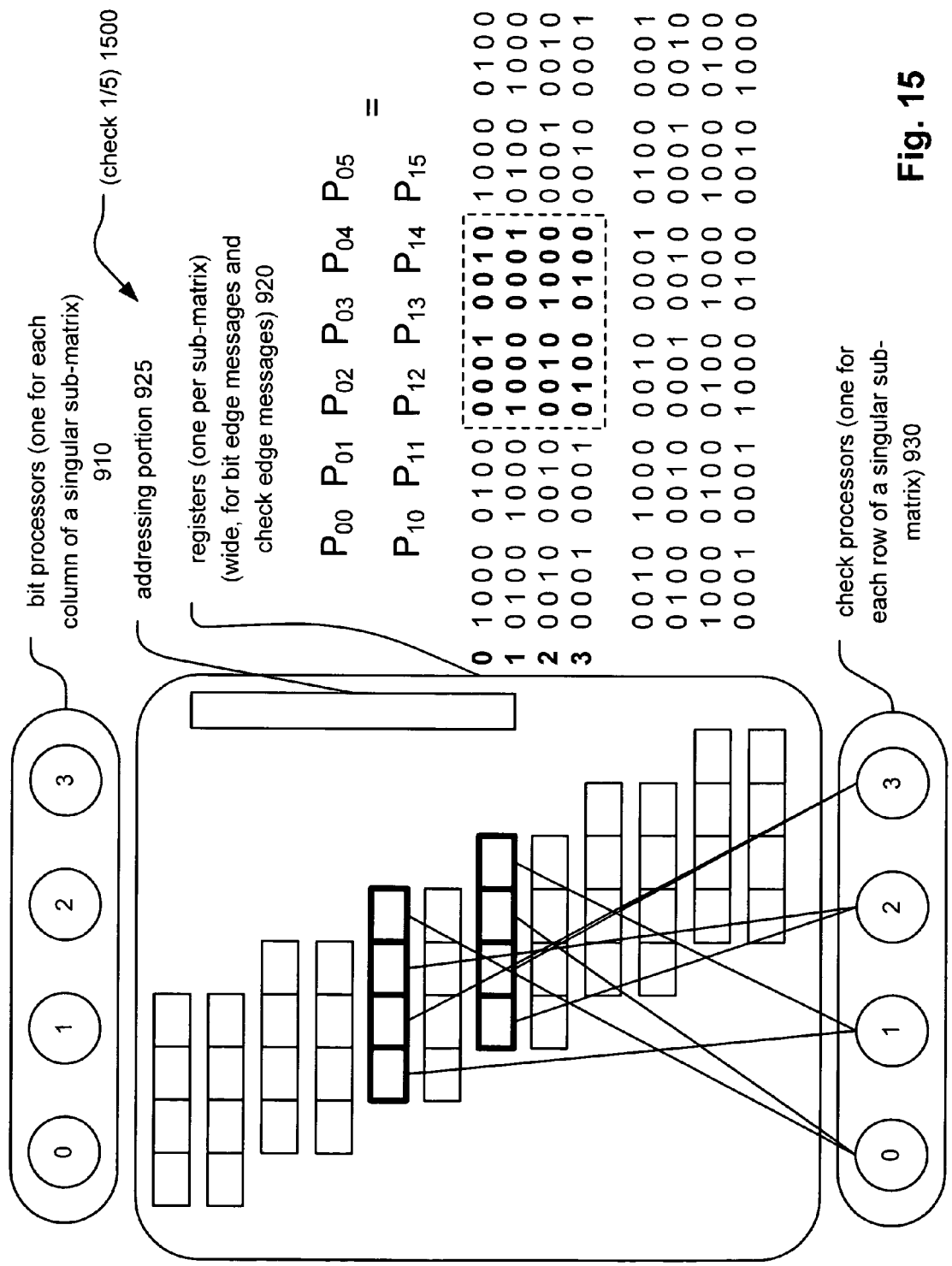
Figure 16:
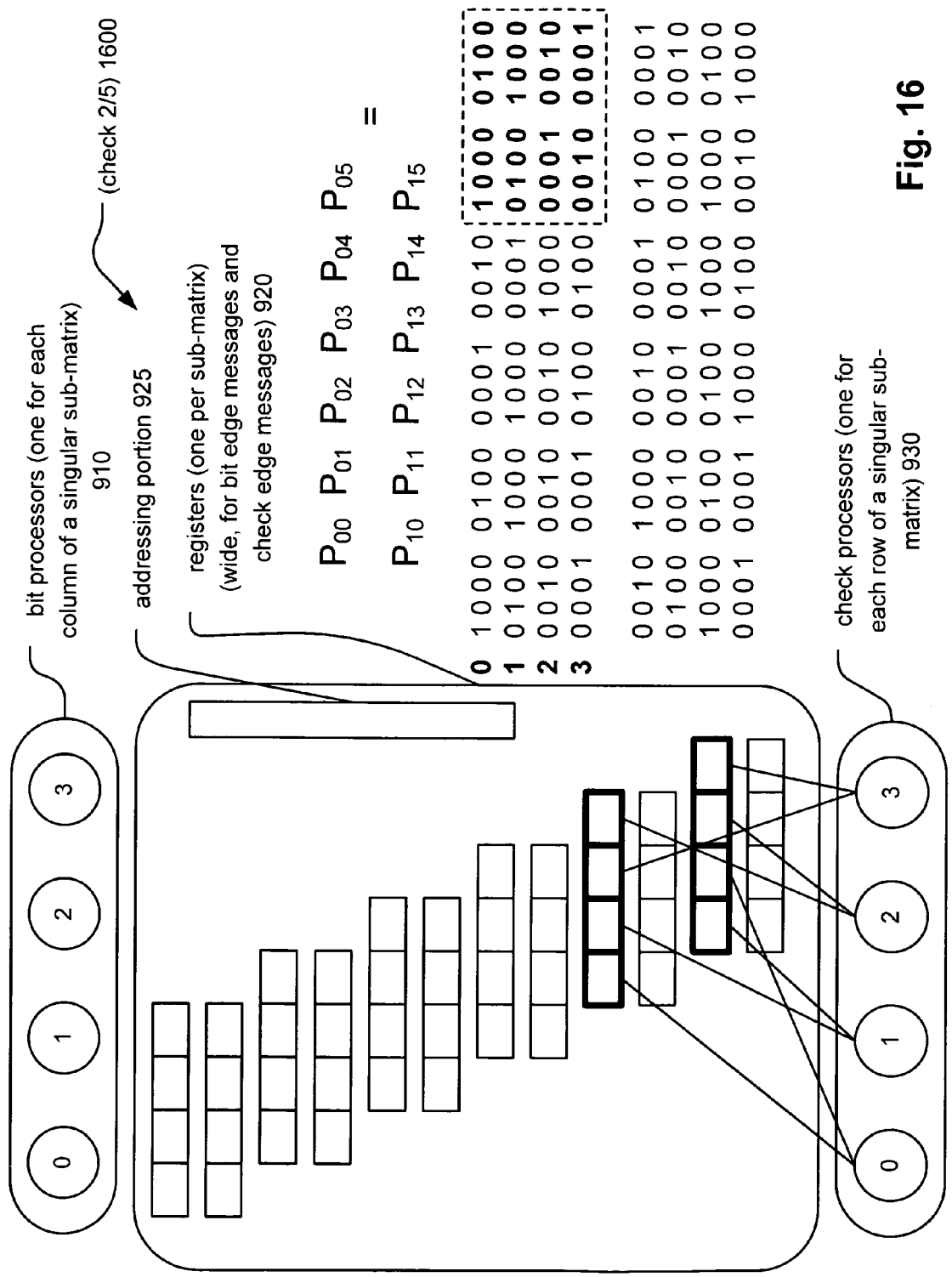
Figure 17:
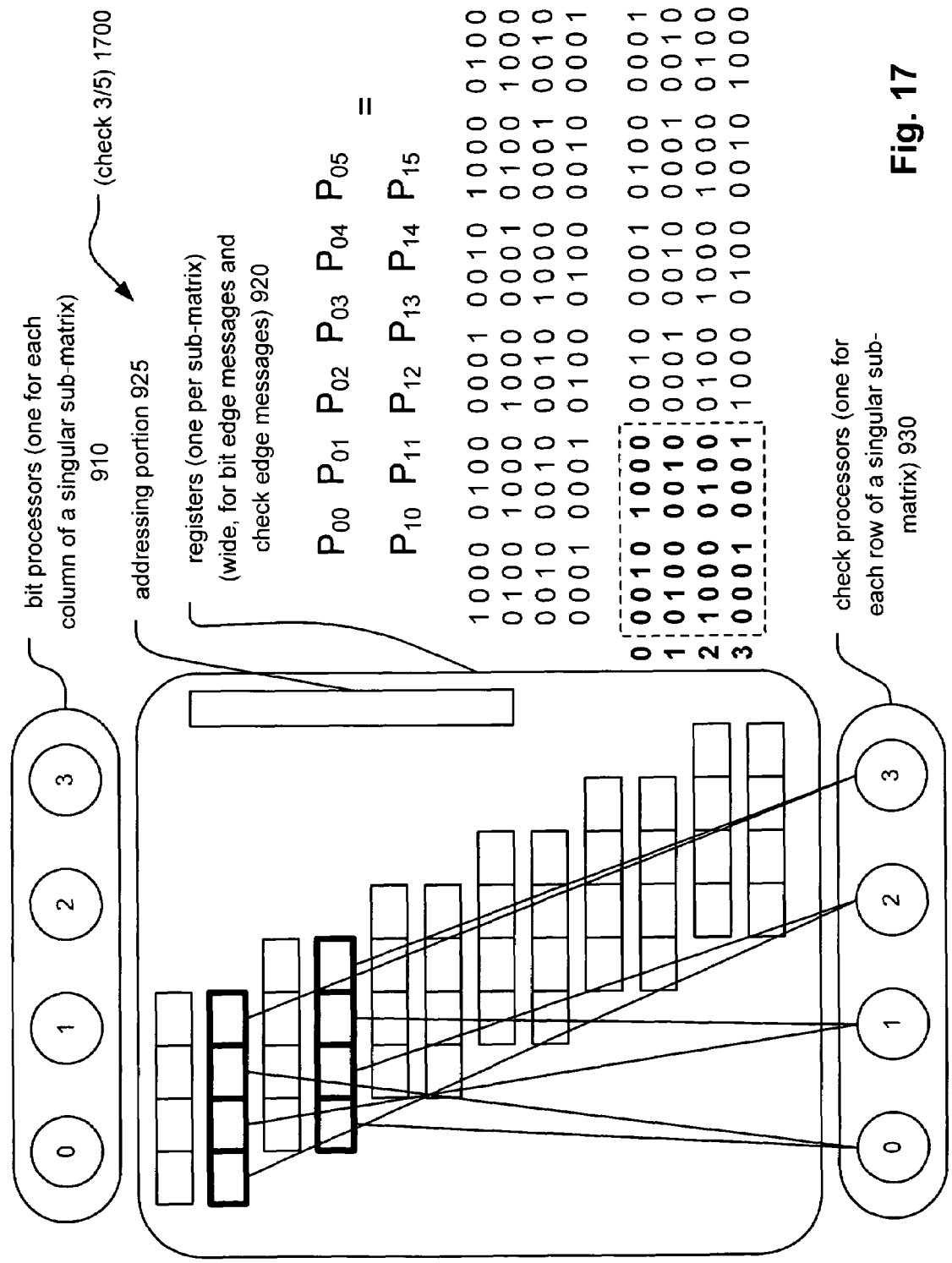

FIG. 12 and FIG. 13 illustrate embodiments 1200 and 1300 of check node processing (0/1) and (1/2) when employing 2 cycles, respectively. In total, 2 cycles are required to perform this approach to check node processing. As also mentioned above, the embodiments 1200 and 1300 employ a total number of check processors 930 that corresponds to the number of rows in each of the individual sub-matrices of the low density parity check matrix, H, of the LDPC code. For example, this embodiment shows that the sub-matrices each include 4 rows, so 4 check processors 930 are shown.

Therefore, in this embodiment, 2 cycles are performed during each check node processing step, and each check processor communicates with $N_s$ of the registers 920. Each check processor is selectively capable to be communicatively coupled to $M_s \times N_s$ registers, this selective communicative coupling can be achieved using MUXes as described above with reference to another embodiment or a number of permuters. If the permuter approach is desired, then the total number of $P_s \times P_s$ permuters required is $N_s$, such that each permuter is capable to perform $M_s$ permutations. The total number of edges that is processed per cycle is also $(P_s \times N_s)$.

During the cycle 0/1 of the check node processing (FIG. 12), the check processors 930 are communicatively coupled to one half of the registers that correspond to the non-zero element locations of the top half of the low density parity check matrix, H. These registers correspond to the sub-matrices: $P_{00}$, $P_{01}$, $P_{02}$, $P_{03}$, $P_{04}$, and $P_{05}$.

During the cycle 1/1 of the check node processing (FIG. 13), the check processors 930 are communicatively coupled to the other half of the registers that correspond to the non-zero element locations of the bottom half of the low density parity check matrix, H. These registers correspond to the sub-matrices: $P_{10}$, $P_{11}$, $P_{12}$, $P_{13}$, $P_{14}$, and $P_{15}$. As can be seen, one half of the check node processing is actually being performed during each of these 2 cycles.

In these embodiments described above, when each bit processor of the bit processors 910 processes one bit edge message at a time, then the total number of bit edge messages processed per cycle is $(P_s \times M_s)$. When each check processor of the check processors 930 processes one check edge message at a time, then the total number of check edge messages processed per cycle is $(P_s \times N_s)$.

Typically, the hardware is determined by the total number of edges that is processed per cycle. It is more efficient to have the number of edges being processed per cycle to vary as little as possible. Therefore, a designer can employ a design such that each of the bit processors 910 and the check processors 930 process different numbers of edge at a time. That is to say, the number of bit edge messages being processed by each bit processor need not be the same as the number of check edge messages being processed by each check processor at a given time. For example, each bit processor can process a first number of bit edges messages, and each check processor can process a second number of check edges messages. This way, the total number of edges being processed during each cycle can be designed to be as close as possible to being the same. In those cases where $N_s$ is divisible by $M_s$, then a designer can modify the design so that the number of check edge messages being processed per check node processing cycle is also $(P_s \times M_s)$, which is the number of bit edge messages being processed per bit node processing cycle.

Some of the following embodiments of check node processing provide a means by which the number of check edge messages being processed per check node processing cycle can be $(P_s \times M_s)$, which is the number of bit edge messages being processed per bit node processing cycle. This makes for a more efficient design, in that, fewer of the processors (i.e., either bit node processors or check node processors) are left idle at any given time. In embodiments in which a check node processor and a bit node processor share at least a portion of components and/or circuitry, this can make for a much more efficient design.

FIG. 14, FIG. 15, FIG. 16, and FIG. 17 illustrate embodiments 1400, 1500, 1600, and 1700 of check node processing (0/5), (1/5), (2/5), and (3/5) when employing 6 cycles, respectively. In total, $N_s$ cycles are required to perform this approach to check node processing. In this embodiment, each check processor communicates with $M_s$ of the registers 920 during each of the $N_s$ cycles. Each check processor is selectively capable to be communicatively coupled to $M_s \times N_s$ registers, this selective communicative coupling can be achieved using MUXes as described above with reference to another embodiment or a number of permuters. If the permuter approach is desired, then the total number of $P_s \times P_s$ permuters required is $M_s$, such that each permuter is capable to perform $N_s$ permutations. The total number of edges that is processed per cycle is therefore $(P_s \times M_s)$, which is which is the number of bit edge messages being processed per bit node processing cycle.

Looking at the processing of the specific low density parity check matrix, H, during the cycle 0/5 of the check node processing (FIG. 14), the check processors 930 are communicatively coupled to two of the registers 920 that correspond to the non-zero element locations of the sub-matrices: $P_{00}$ and $P_{01}$.

During the cycle 1/5 of the check node processing (FIG. 15), the check processors 930 are communicatively coupled to two of the registers 920 that correspond to the non-zero element locations of the sub-matrices: $P_{02}$ and $P_{03}$.

During the cycle 2/5 of the check node processing (FIG. 16), the check processors 930 are communicatively coupled to two of the registers 920 that correspond to the non-zero element locations of the sub-matrices: $P_{10}$ and $P_{11}$.

During the cycle 3/5 of the check node processing (FIG. 16), the check processors 930 are communicatively coupled to two of the registers 920 that correspond to the non-zero element locations of the sub-matrices: $P_{04}$ and $P_{05}$.

The subsequent 2 cycles (since there are 6 in total for this embodiment) are performed analogously to the cycles described above by processing the sub-matrices ($P_{12}$ and $P_{13}$) and then the sub-matrices ($P_{14}$ and $P_{15}$).

As mentioned above with reference to other embodiments, one or more permuters can be employed to ensure the appropriate alignment of the bit edge messages (after being updated) for use in check node processing. There are also a variety of means by which the permuters can be implemented. For example, the permuters can be implemented as a general $P_s \times P_s$ crossbar switch governed by control signals for each switch to allow the ability to accommodate a variety of permutations. These control signals can be retrieved from a memory, provided by a permutation generator, or provided from some other means. However, if the number of permutations required in a given application is relatively small, then it may be more efficient to implement the permuters with random logic. The outputs of each permuter would then depend on the corresponding sub-matrix and the current step number.

Several of the following embodiments operate according to a double-sub-matrix approach, in that, 2 columns or 2 rows of sub-matrices are processed at a time.

Figure 18:
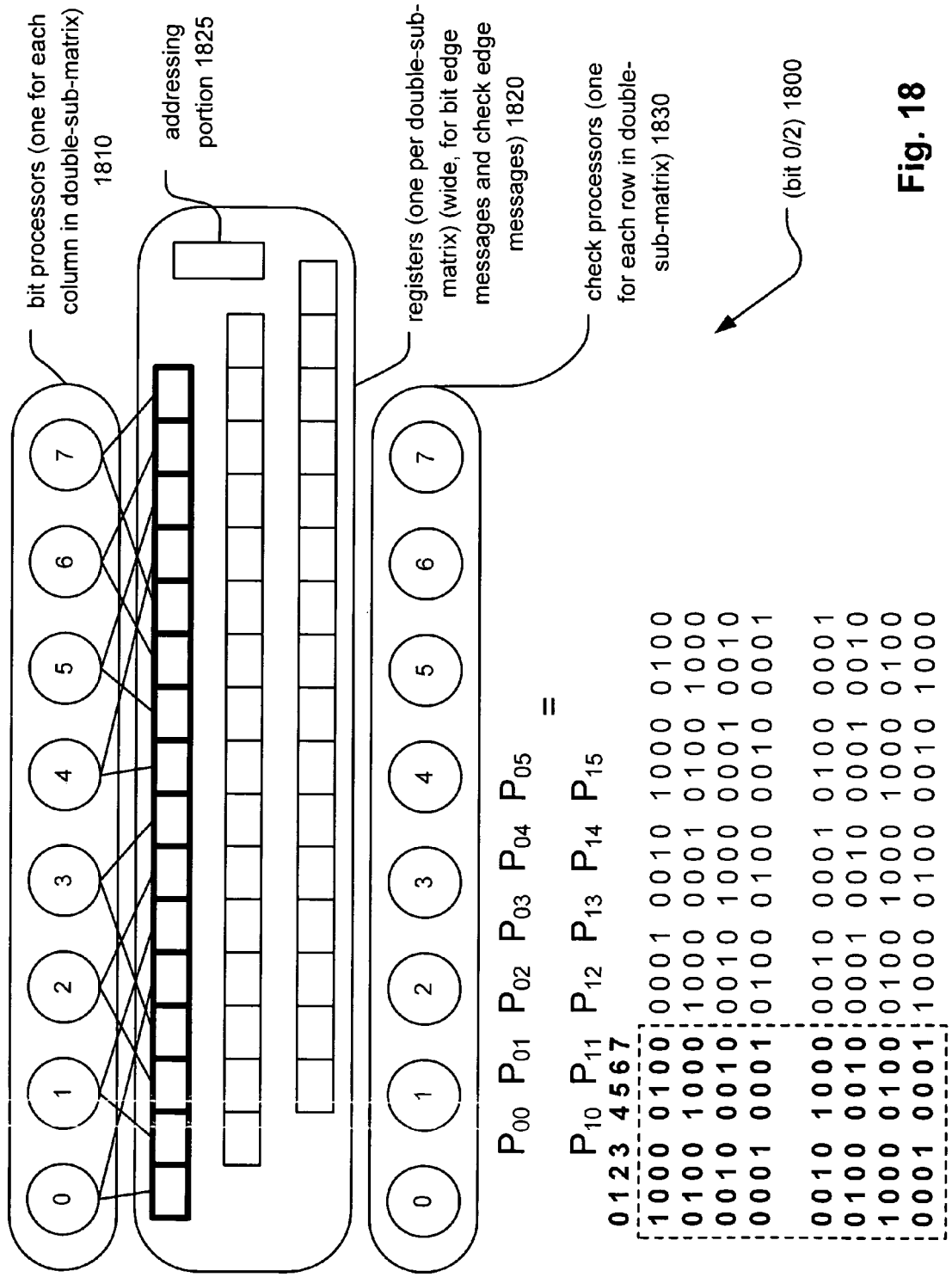
FIG. 18 and FIG. 19 illustrate embodiments of bit node processing (0/2) and (1/2) when employing 3 cycles according to a double-sub-matrix approach, respectively.
Figure 19:
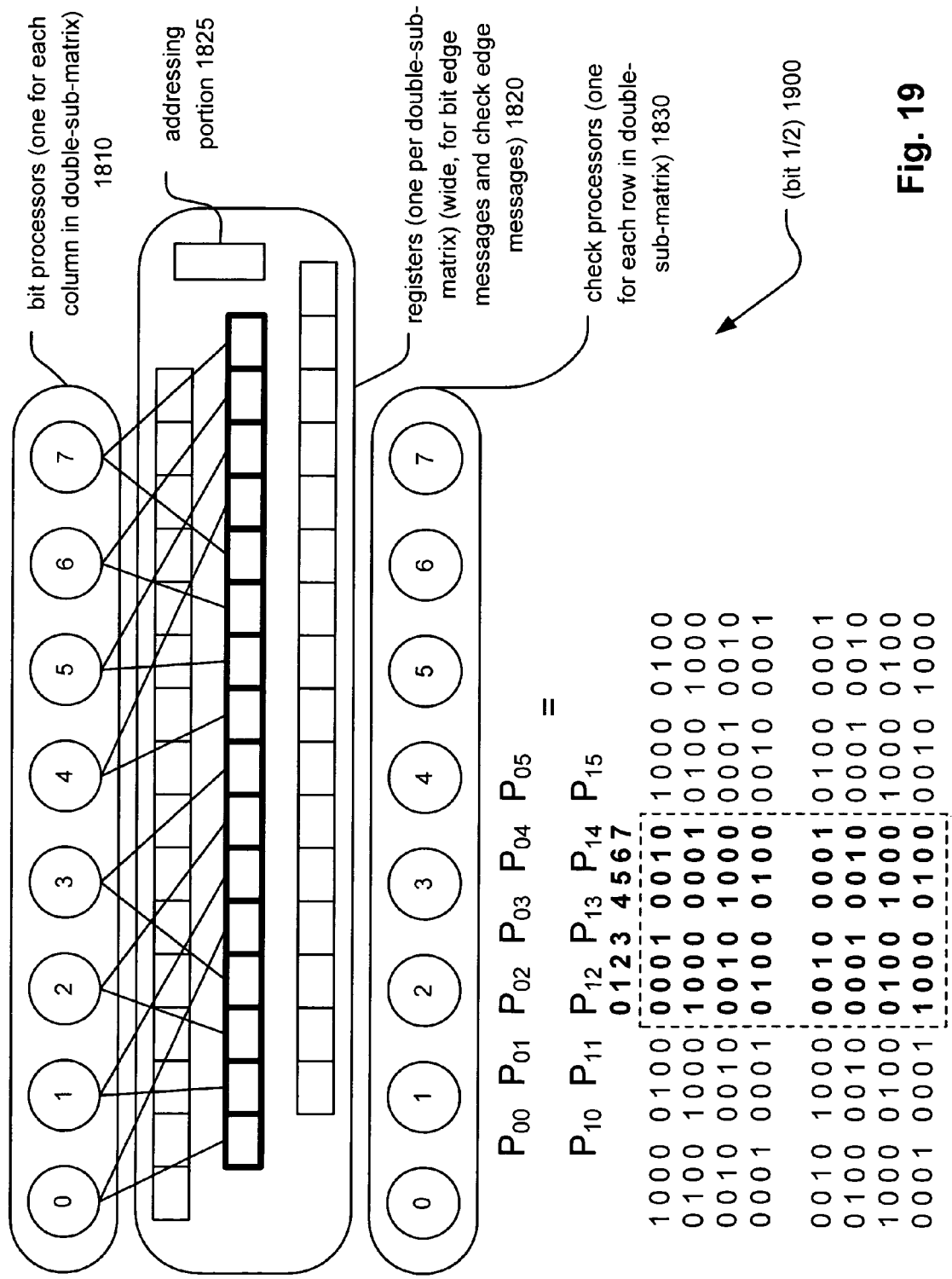

FIG. 18 and FIG. 19 illustrate embodiments 1800 and 1900 of bit node processing (0/2) and (1/2) when employing 3 cycles according to a double-sub-matrix approach, respectively.

In total, $N_s/2$ cycles are required to perform this approach to bit node processing. The total number of bit processors 1810 corresponds to the number of columns in each of the individual double-sub-matrices of the low density parity check matrix, H, of the LDPC code. For example, this embodiment shows that the double-sub-matrices each include 8 columns, so 8 bit processors 1810 are shown. However, for a low density parity check matrix, H, having larger (or smaller) sized double-sub-matrices having a different number of columns, the number of bit processors 1810 could be adjusted accordingly.

Also, the embodiments 1800 and 1900 employ a total number of check processors 1830 that corresponds to the number of rows in each of the individual double-sub-matrices of the low density parity check matrix, H, of the LDPC code. For example, this embodiment shows that the double-sub-matrices each include 8 rows, so 8 check processors 1830 are shown. However, for a low density parity check matrix, H, having larger (or smaller) sized double-sub-matrices having a different number of rows, the number of check processors 1830 could also be adjusted accordingly (just as the number of bit processors 1810 could be adjusted, as described above).

In addition, a plurality of registers 920 is employed to store the bit edge messages and the check edge messages when performing bit node processing and check node processing. The total number of registers 920 employed can be selected to correspond to the number of double-sub-matrices into which the low density parity check matrix, H, is partitioned. For example, this particular embodiment shows a low density parity check matrix, H, that is composed of a plurality of permutation matrices, depicted by $P_{00}$, $P_{10}$, $P_{02}$, $P_{03}$, $P_{04}$, $P_{05}$, $P_{10}$, $P_{11}$, $P_{12}$, $P_{13}$, $P_{14}$, and $P_{15}$. These 12 sub-matrices are partitioned into 3 separate double-sub-matrices for each of bit node processing and check node processing in the embodiment depicted.

As mentioned above, in this embodiment, $N_s/2$ cycles are performed during each bit node processing step, and each bit processor communicates with $M_s/2$ registers during each cycle. In this particular embodiment, $N_s/2=6/2=3$ cycles are performed during each bit node processing step, and each bit processor communicates with $M_s/2=2/2=1$ register in the embodiment depicted. Each bit processor is selectively capable to be communicatively coupled to $((M_s \times N_s)/4)$ registers, this selective communicative coupling can be achieved using MUXes as described above with reference to another embodiment. Each bit processor communicatively couples with $M_s/2$ of the registers 920 during any one cycle; each bit processor can be capable to connect to $((M_s \times N_s)/4)$ registers. If the MUX approach is desired, then the total number of $N_s/2$ to 1 MUXes required is $(2 \times P_s \times M_s)$. The total number of edges that is processed per cycle is $(P_s \times M_s \times 2)$.

Looking at more detail of the processing through the low density parity check matrix, H, during the cycle (0/2) as shown in embodiment 18 of the FIG. 18, the left hand most double-sub-matrix undergoes bit node processing. Referring to embodiment 1900 of the FIG. 19 during the cycle (1/2), the next double-sub-matrix to the right undergoes bit node processing; this process continues processing through all of the double-sub-matrices into which the low density parity check matrix, H, is partitioned. That it to say, each of the double-sub-matrices of the low density parity check matrix, H, undergoes bit node processing successively until all of the low density parity check matrix, H, has undergone bit node processing.

Figure 20:
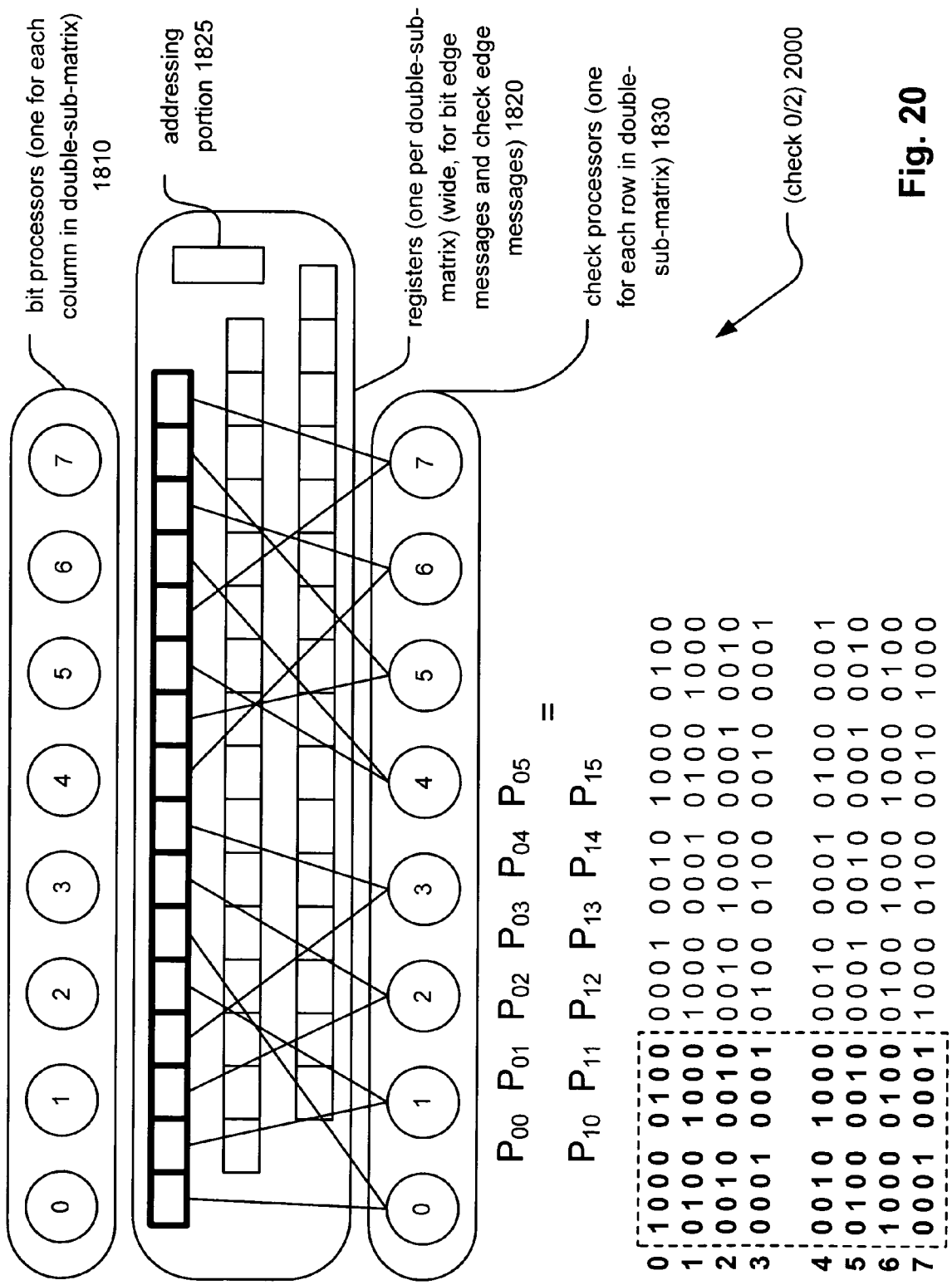
FIG. 20 and FIG. 21 illustrate embodiments of check node processing (0/2) and (1/2) when employing 3 cycles according to a double-sub-matrix approach, respectively.
Figure 21:
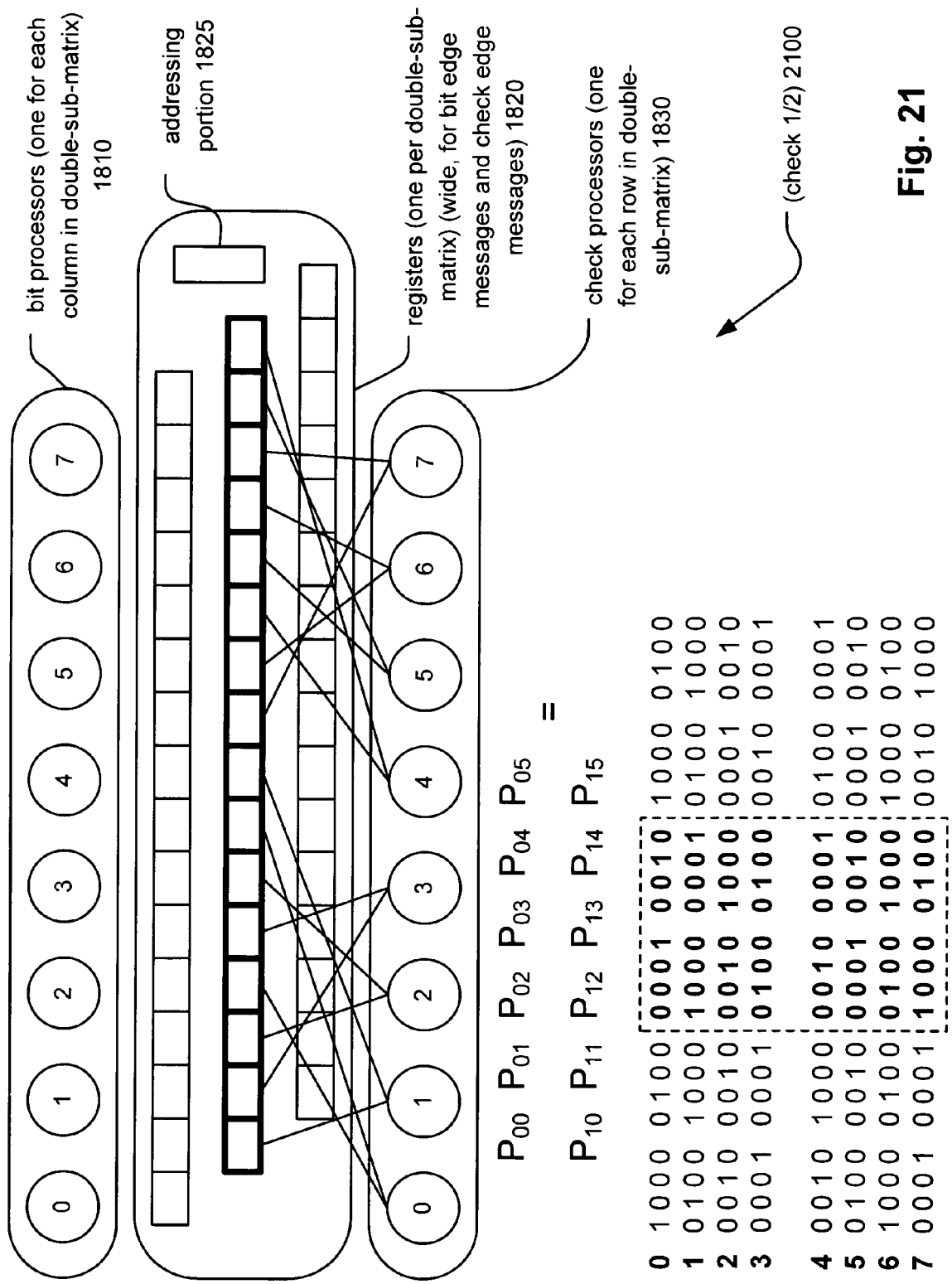

FIG. 20 and FIG. 21 illustrate embodiments 2000 and 2100 of check node processing (0/2) and (1/2) when employing 3 cycles according to a double-sub-matrix approach, respectively.

In this embodiment, $N_s/2$ cycles are performed during each check node processing step, and each check processor communicates with $M_s/2$ registers. In this particular embodiment, $N_s/2=6/2=3$ cycles are performed during each check node processing step, and each selectively capable processor communicates with $M_s/2=2/2=1$ register in the embodiment depicted. Each check processor is selectively capable to be communicatively coupled to $((M_s \times N_s)/4)$ registers, this selective communicative coupling can be achieved using MUXes or permuters as described above with reference to other embodiments. Each check processor communicatively couples with $M_s/2$ of the registers 920 during any one cycle; each check processor can be capable to connect to $((M_s \times N_s)/4)$ registers. If the permuter approach is desired, then the total number of $(P_s \times P_s)$ permuters required is $(2 \times M_s)$. Each $(P_s \times P_s)$ permuter should be capable to perform $(P_s/2)$ different permutations. The total number of edges that is processed per cycle is $(P_s \times M_s \times 2)$.

Looking at more detail of the processing through the low density parity check matrix, H, during the cycle (0/2), the left hand most double-sub-matrix undergoes check node processing. Referring to embodiment 2100 of the FIG. 21 during the cycle (1/2), the next double-sub-matrix to the right undergoes check node processing; this process continues processing through all of the double-sub-matrices into which the low density parity check matrix, H, is partitioned. That it to say, each of the double-sub-matrices of the low density parity check matrix, H, undergoes check node processing successively until all of the low density parity check matrix, H, has undergone check node processing.

Figure 22:
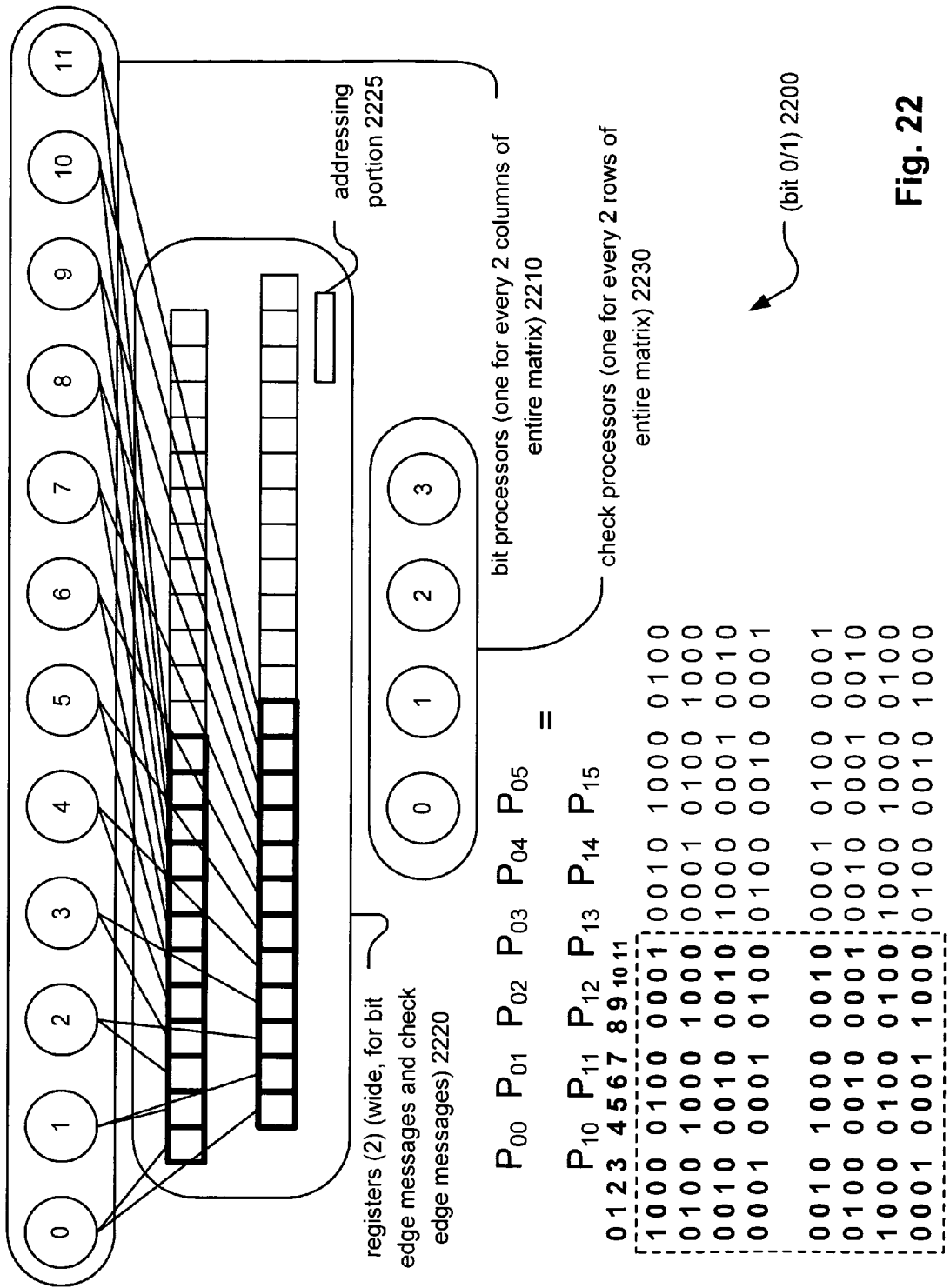
FIG. 22 and FIG. 23 illustrate embodiments of bit node processing (0/2) and (1/2) when employing 2 cycles according to a semi-parallel sub-matrix approach, respectively.
Figure 23:
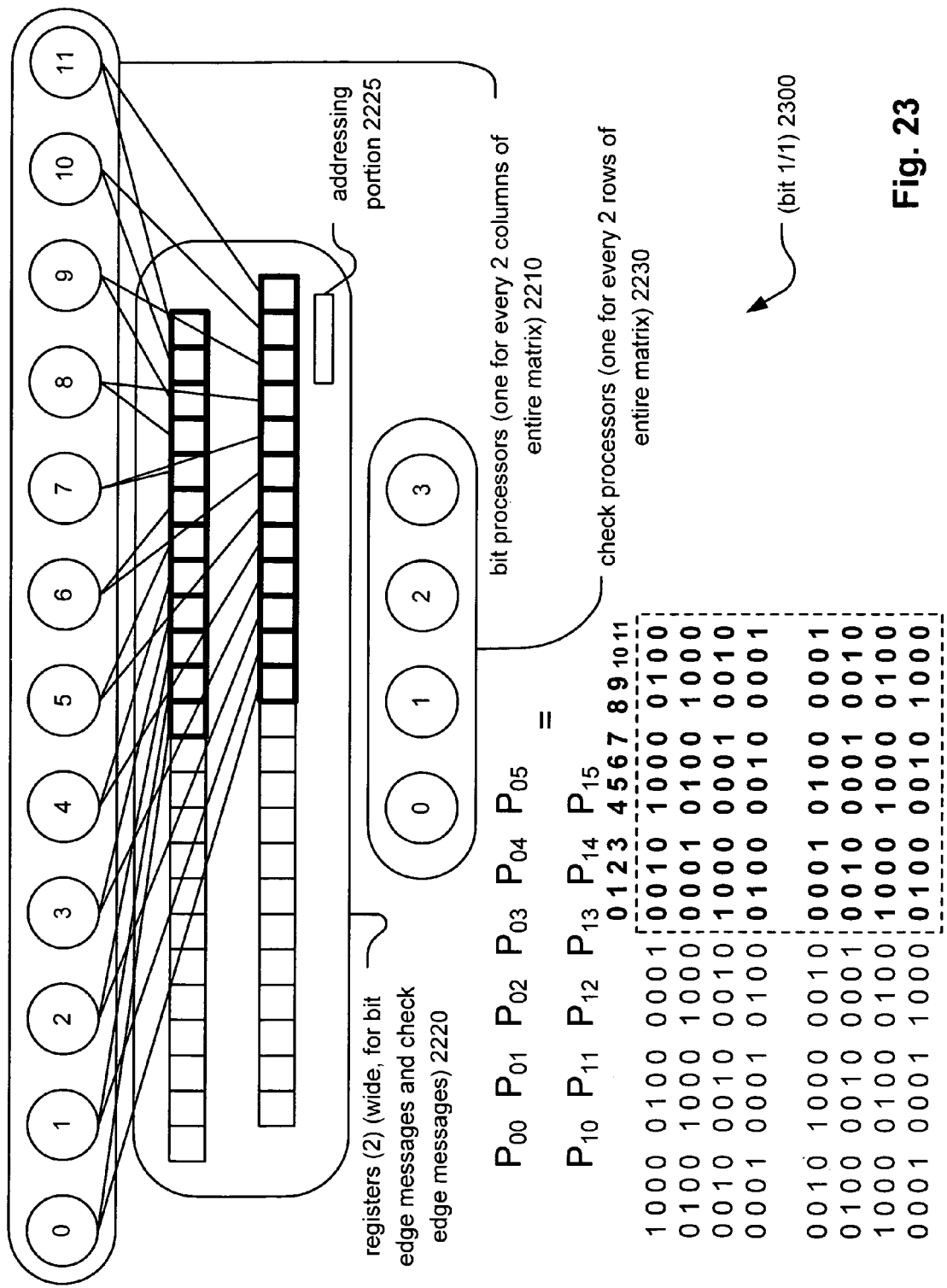

FIG. 22 and FIG. 23 illustrate embodiments 2200 and 2300 of bit node processing (0/1) and (1/1) when employing 2 cycles according to a semi-parallel sub-matrix approach, respectively. In total, 2 cycles are required to perform this semi-parallel sub-matrix approach to bit node processing. This approach can be characterized as a semi-parallel approach, in that, there are 2 cycles that are performed during each bit node processing step. In these embodiments, one bit processor is employed for every two 2 bits, or one bit processor for every 2 columns of the low density parity check matrix, H.

Generally speaking, the embodiments 2200 and 2300 employ a total number of bit processors 2210 that is ½ the total number of columns of the low density parity check matrix, H. Also, the embodiments 2200 and 2300 employ a total number of check processors 2230 that is ½ the total number of rows of the low density parity check matrix, H.

For example, in the illustrated embodiment in which the low density parity check matrix, H, includes 24 columns and 8 rows, 12 bit processors 2210 and 4 check processors 2230 are employed. Two (2) registers 2220 are employed to store the edge messages (i.e., bit edge messages updated during bit node processing, and the check edge messages updated during check node processing). Since this is a semi-parallel implementation, no addressing is required. Therefore, the two (2) registers 2220 need only include 2 registers.

As mentioned above, in this embodiment, 2 cycles are performed during each bit node processing step, and each bit processor communicates with $M_s$ registers during each cycle. Each bit processor is selectively capable to be communicatively coupled to $M_s$ registers, this selective communicative coupling can be achieved using MUXes as described above with reference to another embodiment. If the MUX approach is desired, then the total number of 2 to 1 MUXes required is $(M_s \times P_s \times N_s/2)$. The total number of edges that is processed per cycle is $(P_s \times M_s \times N_s/2)$.

During the cycle (0/1) of the bit node processing 2200 (FIG. 22), the bit processors 2210 are communicatively coupled to the left hand side of the registers 2220 whose locations correspond to the non-zero element locations of the left hand side of the low density parity check matrix, H. Specifically, these locations of the registers 2220 correspond to the left hand side columns of the low density parity check matrix, H. Since this particular low density parity check matrix, H, includes 24 columns, these locations of the registers 2220 correspond to the 12 left hand side columns.

During the cycle (1/1) of the bit node processing 2300 (FIG. 23), the bit processors 2210 are communicatively coupled to the right hand side of the register 2220 whose locations correspond to the non-zero element locations of the right hand side of the low density parity check matrix, H. Specifically, these locations of the registers 2220 correspond to the right hand side columns of the low density parity check matrix, H. Since this particular low density parity check matrix, H, includes 24 columns, these locations of the registers 2220 correspond to the 12 right hand side columns.

Figure 24:
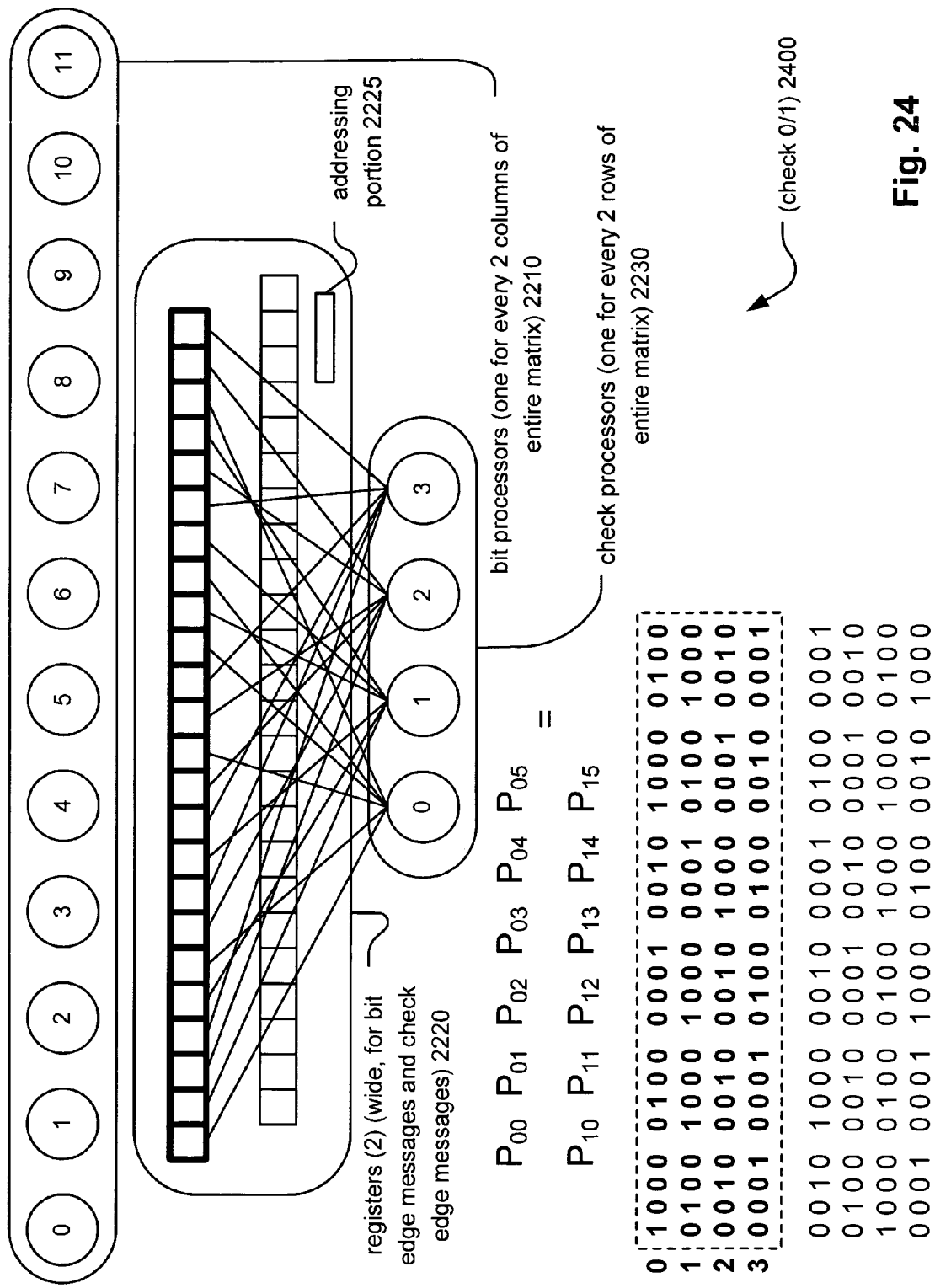
FIG. 24 and FIG. 25 illustrate embodiments of check node processing (0/2) and (1/2) when employing 2 cycles according to a semi-parallel sub-matrix approach, respectively.
Figure 25:
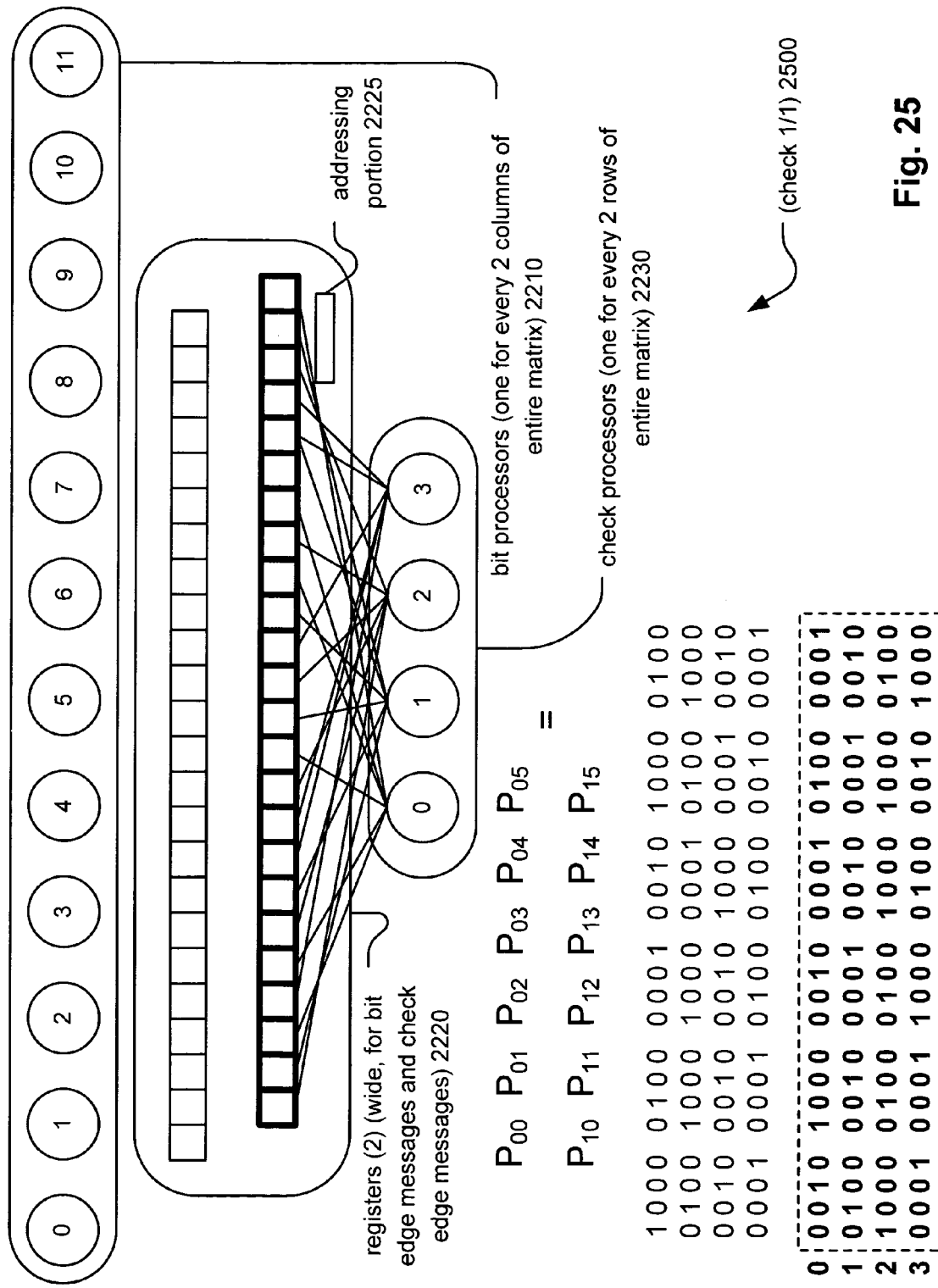

FIG. 24 and FIG. 25 illustrate embodiments 2400 and 2500 of check node processing (0/1) and (1/1) when employing 2 cycles according to a semi-parallel sub-matrix approach, respectively. In total, 2 cycles are required to perform this semi-parallel sub-matrix approach to check node processing. In these embodiments, one check processor is employed for every two 2 checks, or one check processor for every 2 rows of the low density parity check matrix, H.

As mentioned above, in this embodiment, 2 cycles are performed during each check node processing step, and each bit processor communicates with 1 register during each cycle. Each bit processor is selectively capable to be communicatively coupled to $M_s$ registers, this selective communicative coupling can be achieved using MUXes or permuters as described above with reference to other embodiments. If the permuter approach is desired, then the total number of $(P_s \times P_s)$ permuters required is $(M_s \times N_s)$. Each $(P_s \times P_s)$ permuter needs only to be capable to perform 1 permutation. In other words the permuting performed therein can be hardwired. The total number of edges that is processed per cycle is $((P_s \times M_s \times N_s)/2)$.

During the cycle (0/1) of the check node processing 2400 (FIG. 24), the check processors 2230 are communicatively coupled to the top register of the registers 2220 whose locations correspond to the non-zero element locations of the top half of the low density parity check matrix, H. Since this particular low density parity check matrix, H, includes 8 rows, these locations of the registers 2220 correspond to the 4 top rows.

During the cycle (1/1) of the check node processing 2500 (FIG. 25), the check processors 2230 are communicatively coupled to the bottom register of the registers 2220 whose locations correspond to the non-zero element locations of the bottom half of the low density parity check matrix, H. Since this particular low density parity check matrix, H, includes 8 rows, these locations of the registers 2220 correspond to the 4 bottom rows.

It is also noted that the functionality of permutation (i.e., to align the edge messages appropriately when going from bit node processing to check node processing, or vice versa) can be implemented as part of the registers 920 as a function of addressing (e.g., the registers 920, the registers 1820, and the registers 2220). This way, the bit edge messages can be appropriately permuted before undergoing check node processing.

If desired in alternative embodiments, a portion of memory (i.e., a certain number of bits within each of the registers of the registers 920) can be provisioned to ensure the appropriate addressing of the bit edge messages as they are retrieved for use in check node processing.

In addition, in many of the embodiments described above an addressing portion is generally depicted (e.g., the addressing portion 925, the addressing portion 1825, and the addressing portion 2225).

This can alternatively be implemented as one or more permuters that is capable to permute the bit edge messages (after being updated) when retrieved from a memory for use in check node processing. Generally speaking, this addressing portion can be viewed as being permuters, logic circuitry and/or memory for re-aligning bit edge messages for use in check node processing, or for re-aligning check edge messages for use in bit node processing. For example, combinational gates (e.g., some combination of logic gates) can be employed to compute the addresses based on the current step number or on the previous address value. One or more ROMs (Read Only Memories) could also be employed to look up the addresses based on the current step number or on the previous address value (e.g., in a LUT (Look-Up Table) type approach). Of course, as described in other areas, a portion of each of the individual memory locations of any memory could be provisioned to store the next address. This way, a memory read operation then retrieves not only the edge message, but its next permuted address as a side-effect. Any of the embodiments depicted herein can include one or more components capable of performing this functionality to ensure the appropriate ordering of either the bit edge messages or the check edge messages (depending on which of the bit edge messages or the check edge messages are kept in a "friendly" order), as desired in a given application.

Figure 26:
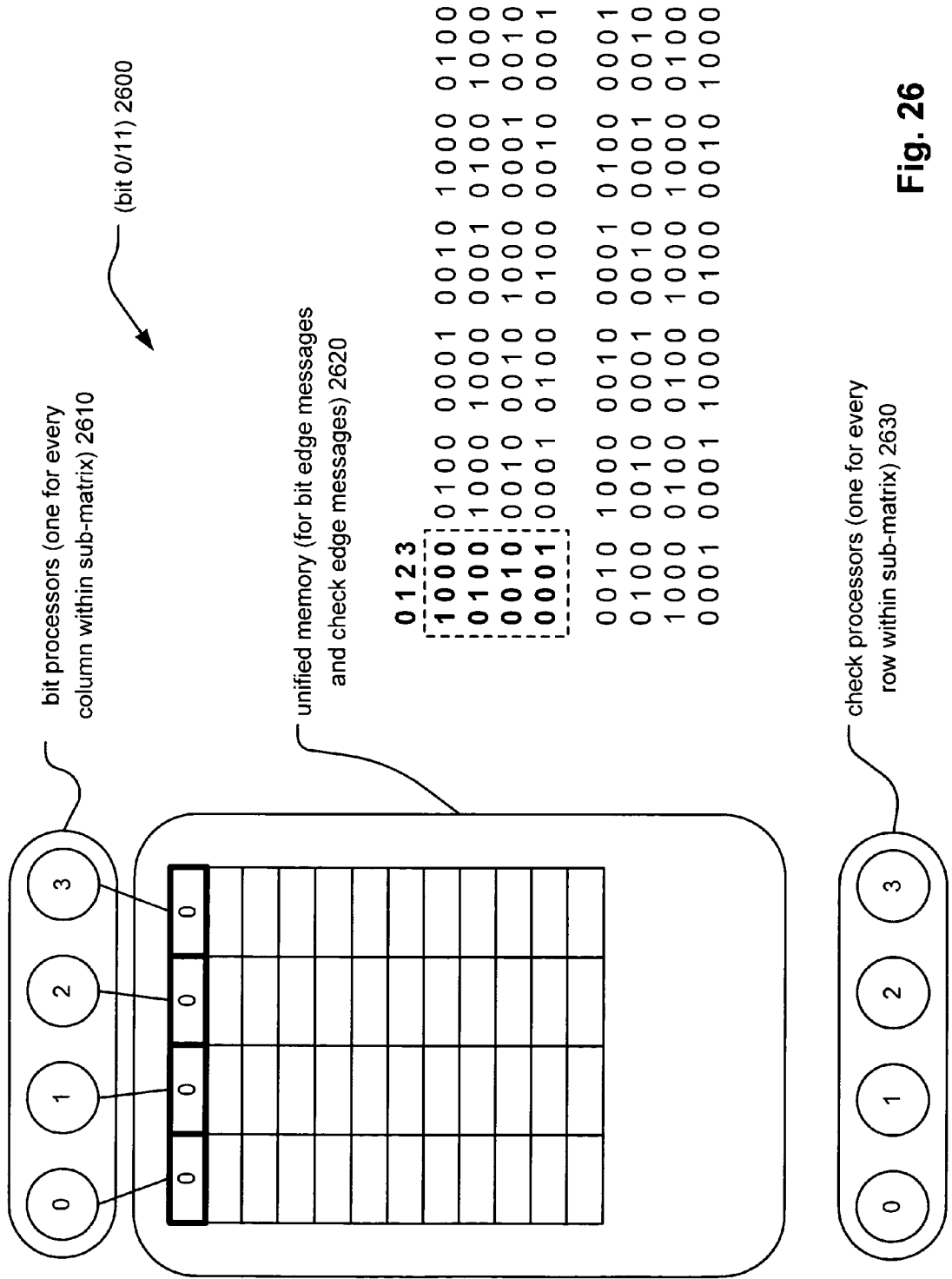
FIG. 26, FIG. 27, and FIG. 28 illustrate embodiments of bit node processing (0/11), (0/11), and (2/11) when employing 12 cycles according to a fully serial sub-matrix approach, respectively.
Figure 27:
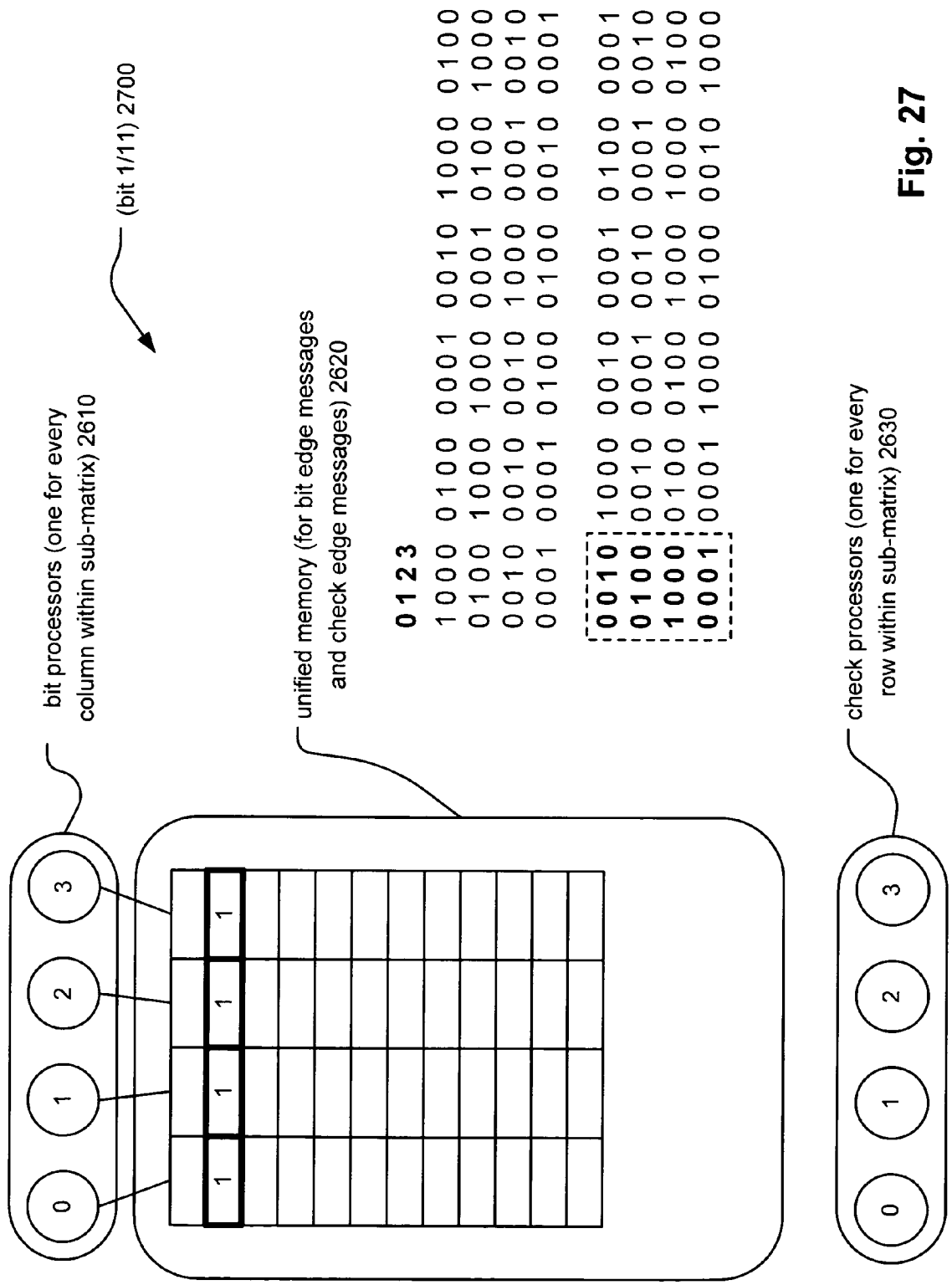
Figure 28:
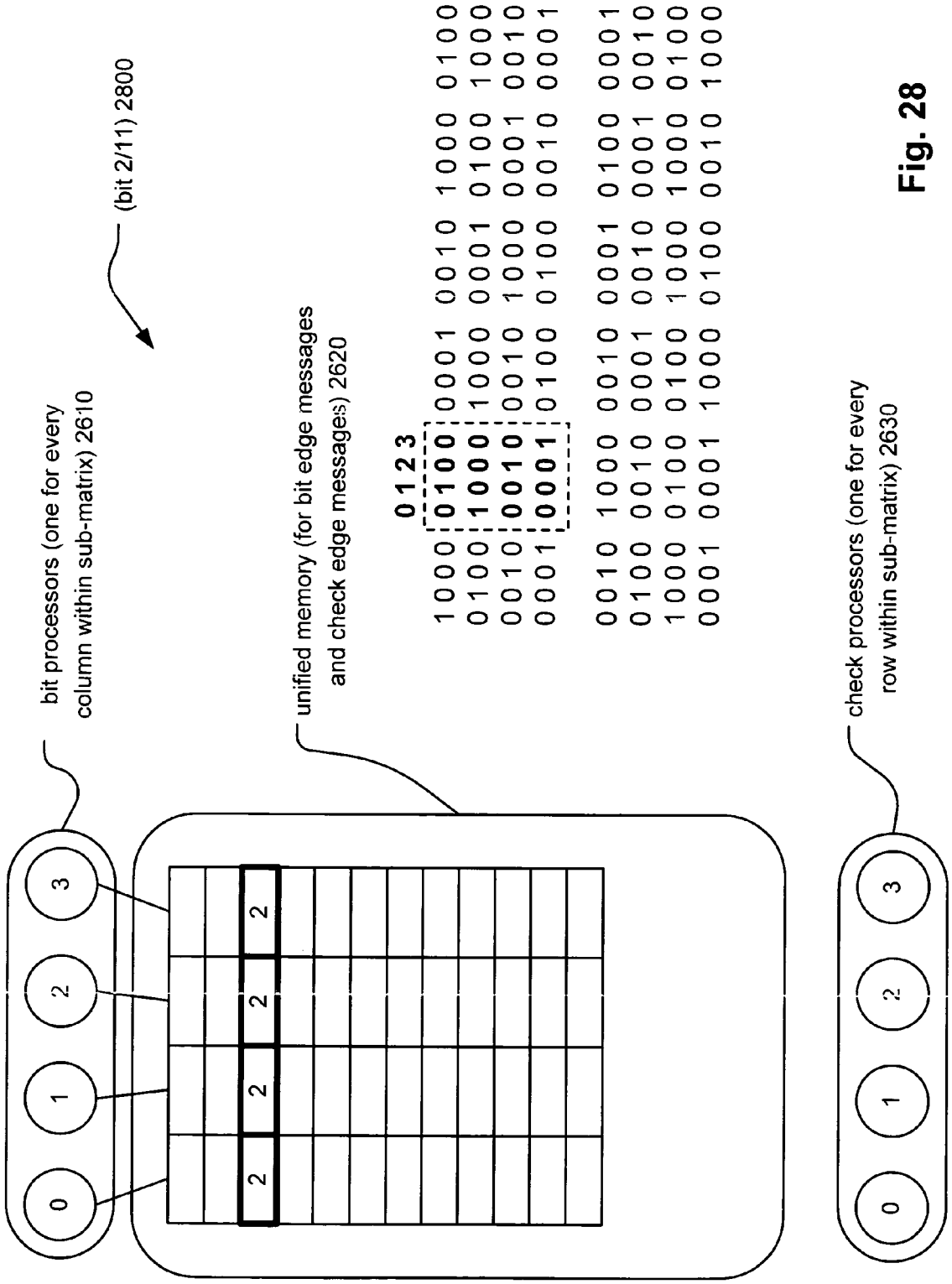

FIG. 26, FIG. 27, and FIG. 28 illustrate embodiments of bit node processing (0/11), (0/11), and (2/11) when employing 12 cycles according to a fully serial sub-matrix approach, respectively.

In total, 12 cycles are required to perform each of bit node processing and check node processing this fully serial sub-matrix approach to bit node processing because the low density parity check matrix, H, is partitioned into 12 sub-matrices.

Generally speaking, the embodiments 2600, 2700, and 2800 employ a total number of bit processors 2610 such that there is one bit processor for every column within any one of the sub-matrices of the low density parity check matrix, H. Also, the embodiments 2900, 3000, and 3100 employ a total number of check processors 2630 such that there is one check processor for every row within any one of the sub-matrices of the low density parity check matrix, H.

For example, in the illustrated embodiment in which the low density parity check matrix, H, includes 24 columns and 8 rows, 4 bit processors 2610 and 4 check processors 2630 are employed. A (single) unified memory 2620 is employed to store the edge messages (i.e., bit edge messages updated during bit node processing, and the check edge messages updated during check node processing).

As mentioned above, in this embodiment, 12 cycles are performed during each bit node processing step, and each bit processor communicates the unified memory 2620.

Generally speaking based on the conventions employed above (e.g., $M_s$, $N_s$ and $P_s$) to describe any generalized low density parity check matrix, H, the bit node processing takes $M_s \times N_s$ cycles, and each bit processor communicates the unified memory 2620 that has a size of $((M_s \times N_s) \times P_s)$. In this embodiment depicted, $M_s=2$, $N_s=6$, and $P_s=4$. The overall size of the LDPC is $((N_s \times P_s)$ columns$\times(M_s \times P_s)$ rows) or $((6 \times 4)$ columns$\times(2 \times 4)$ rows) or (24 columns$\times$12 rows). Therefore, the bit node processing takes $M_s \times N_s=2 \times 6=12$ cycles in this embodiment. Because of the use of the unified memory 2620, no MUXes are needed. The total number of edges that is processed per cycle is $P_s$. Since $P_s=4$ in this embodiment, then 4 edges are processed each cycle.

During the cycle (0/11) of the bit node processing 2600 (FIG. 26), the bit processors 2610 access the memory locations of the unified memory 2620 corresponding to the non-zero element locations of the first 4×4 sub-matrix within the low density parity check matrix, H. In this example, this sub-matrix is the upper-left most sub-matrix of the low density parity check matrix, H. Since there are 4 non-zero elements in the 4×4 sub-matrix, 4 Memory locations are accessed within the unified memory 2620.

During the cycle (1/11) of the bit node processing 2700 (FIG. 27), the bit processors 2610 access the memory locations of the unified memory 2620 corresponding to the non-zero element locations of the second 4×4 sub-matrix within the low density parity check matrix, H. In this example, this sub-matrix is the lower-left most sub-matrix of the low density parity check matrix, H. Since there are 4 non-zero elements in the 4×4 sub-matrix, 4 memory locations are accessed within the unified memory 2620.

During the cycle (2/11) of the bit node processing 2800 (FIG. 28), the bit processors 2610 access the memory locations of the unified memory 2620 corresponding to the non-zero element locations of the third 4×4 sub-matrix within the low density parity check matrix, H. In this example, this sub-matrix is the upper-$2^{nd}$ from left most sub-matrix of the low density parity check matrix, H. Since there are 4 non-zero elements in the 4×4 sub-matrix, 4 memory locations are accessed within the unified memory 2620.

The next sub-matrix directly underneath the sub-matrix processed in cycle (2/11) is then processed using bit node processing. This fully serial sub-matrix approach continues processing through all of the sub-matrices into which the low density parity check matrix, H, is partitioned. That it to say, each of the sub-matrices of the low density parity check matrix, H, undergoes bit node processing successively until all of the low density parity check matrix, H, has undergone bit node processing.

Figure 29:
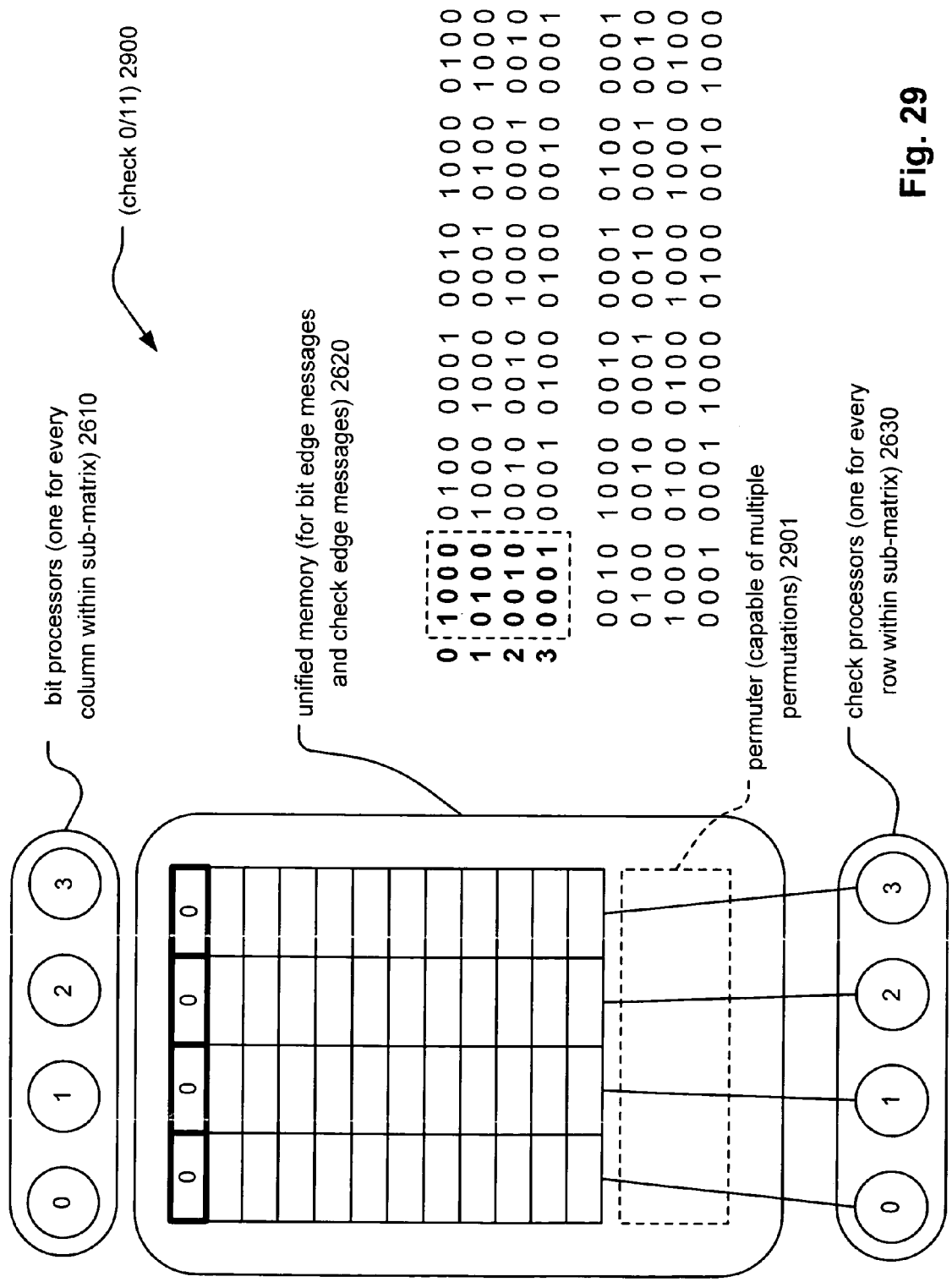
FIG. 29, FIG. 30, and FIG. 31 illustrate embodiments of check node processing (0/11), (0/11), and (2/11) when employing 12 cycles according to a fully serial sub-matrix approach, respectively.
Figure 30:
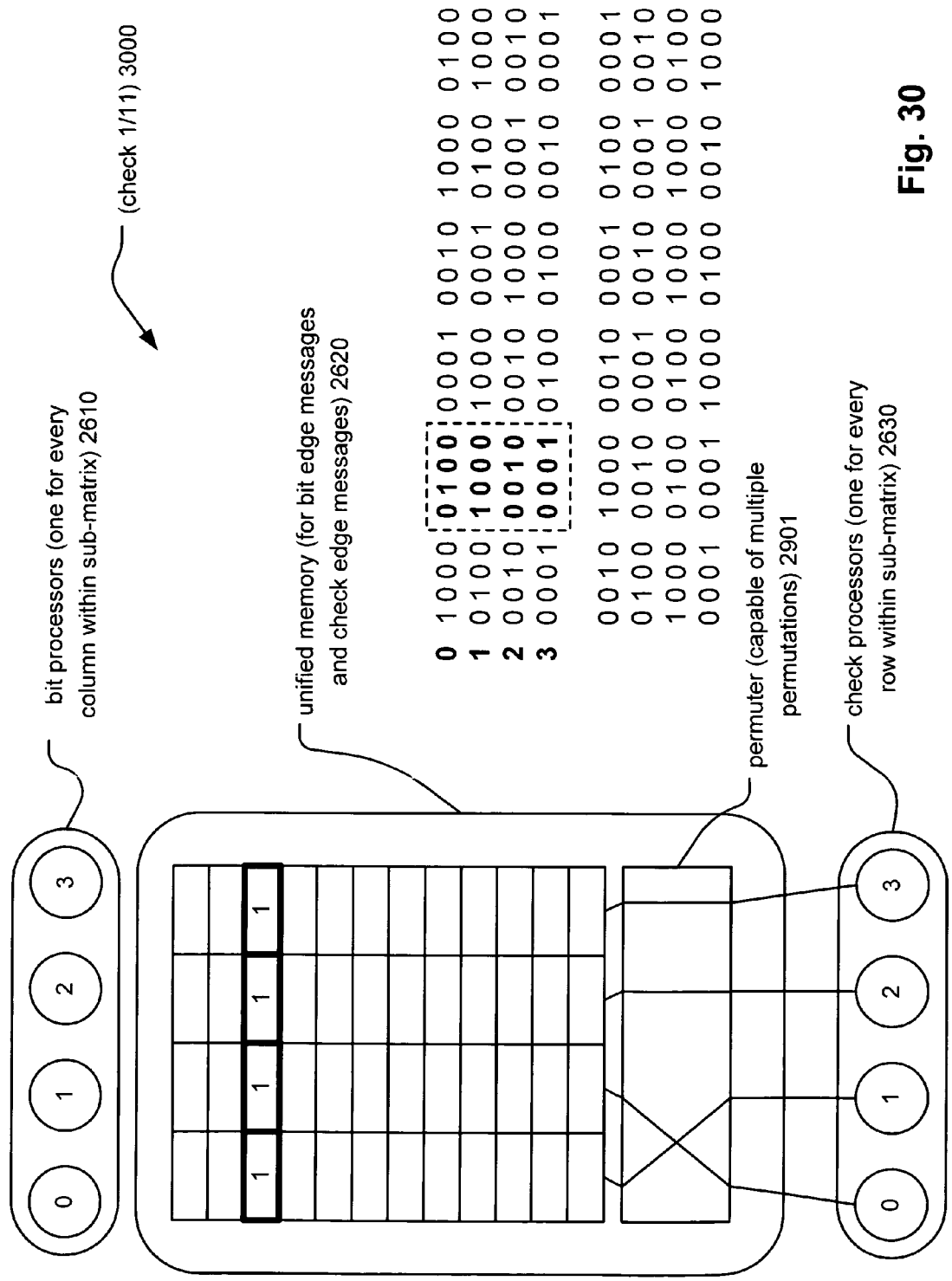
Figure 31:
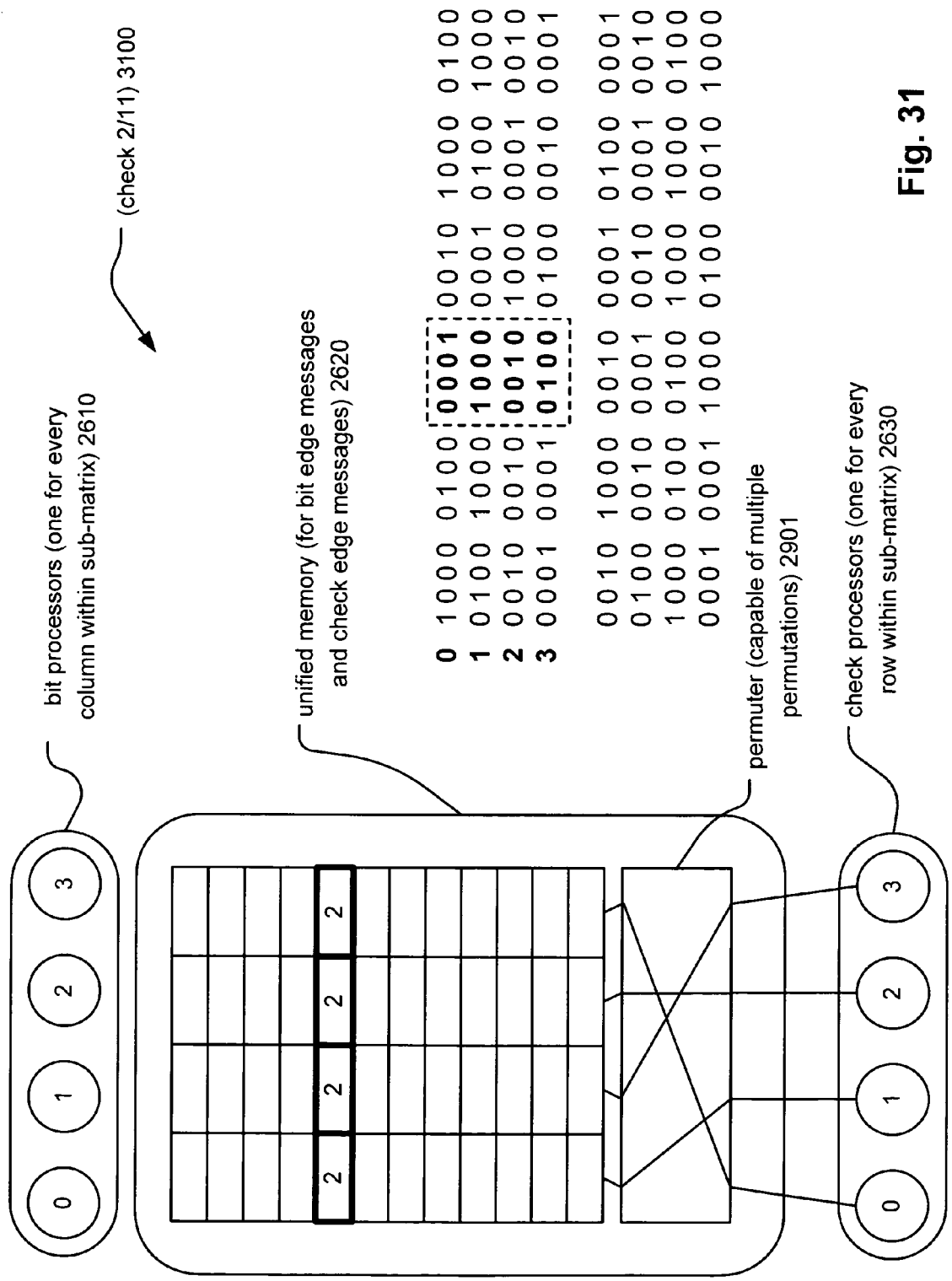

FIG. 29, FIG. 30, and FIG. 31 illustrate embodiments of check node processing (0/11), (0/11), and (2/11) when employing 12 cycles according to a fully serial sub-matrix approach, respectively.

Generally speaking based on the conventions employed above (e.g., $M_s$, $N_s$ and $P_s$) to describe any generalized low density parity check matrix, H, the check node processing takes $M_s \times N_s$ cycles, and each check processor communicates the unified memory 2620 that has a size of $((M_s \times N_s) \times P_s)$. In this embodiment depicted, $M_s=2$, $N_s=6$, and $P_s=4$. The overall size of the LDPC is $((N_s \times P_s)$ columns$\times(M_s \times P_s)$ rows) or $((6 \times 4)$ columns$\times(2 \times 4)$ rows) or (24 columns$\times$12 rows). Therefore, the check node processing takes $M_s \times N_s=2 \times 6=12$ cycles in this embodiment.

As mentioned above, permuters are employed to maintain proper ordering for check node processing. When using permuters (e.g., as one of which is specifically referenced as permuter 2901), then a permuter capable to perform $(P_s \times P_s)$ permutations is required. There are many ways in which the permuters can be implemented. For example, a single $(P_s \times P_s)$ permuter capable to perform $(M_s \times N_s)$ different permutations can be employed. In the instances that the sub-matrices of the low density parity check matrix, H, are CSI (Cyclic Shifted Identity) sub-matrices, then a barrel shifter could be employed to perform the permutations (this is because of the particular structures of the CSI sub-matrices such that each is a cyclic shifted version of an identify matrix).

Because of the use of the unified memory 2620, no MUXes are needed. The total number of edges that is processed per cycle is $P_s$. Since $P_s=4$ in this embodiment, then 4 edges are processed each cycle.

During the cycle (0/11) of the check node processing 2900 (FIG. 29), the check processors 2630 access the memory locations of the unified memory 2620 corresponding to the non-zero element locations of the first 4×4 sub-matrix within the low density parity check matrix, H. In this example, this sub-matrix is the upper-left most sub-matrix of the low density parity check matrix, H. Since there are 4 non-zero elements in the 4×4 sub-matrix, 4 memory locations are accessed within the unified memory 2620. Since this particular sub-matrix is already an identify sub-matrix, the permuter 2901 can be bypassed when processing this particular sub-matrix.

During the cycle (1/11) of the check node processing 3000 (FIG. 30), the check processors 2630 access the memory locations of the unified memory 2620 corresponding to the non-zero element locations of the second 4×4 sub-matrix within the low density parity check matrix, H. In this example, this sub-matrix is the upper-$2^{nd}$ from left most sub-matrix of the low density parity check matrix, H. Since there are 4 non-zero elements in the 4×4 sub-matrix, 4 memory locations are accessed within the unified memory 2620. When processing this sub-matrix, the permuter 2901 does need to perform re-aligning of the edge messages for appropriate check node processing.

During the cycle (2/11) of the check node processing 3100 (FIG. 31), the check processors 2630 access the memory locations of the unified memory 2620 corresponding to the non-zero element locations of the third 4×4 sub-matrix within the low density parity check matrix, H. In this example, this sub-matrix is the upper-$3^{rd}$ from left most sub-matrix of the low density parity check matrix, H. Since there are 4 non-zero elements in the 4×4 sub-matrix, 4 memory locations are accessed within the unified memory 2620. When processing this sub-matrix, the permuter 2901 does need to perform re-aligning of the edge messages for appropriate check node processing.

The next sub-matrix directly to the right of the sub-matrix processed in cycle (2/11) is then processed using check node processing. When the end of this row of sub-matrices is reaches, then the cycle (6/12) of check node processing processed the lower-left most sub-matrix within the low density parity check matrix, H. This fully serial sub-matrix approach continues processing through all of the sub-matrices into which the low density parity check matrix, H, is partitioned. That it to say, each of the sub-matrices of the low density parity check matrix, H, undergoes check node processing successively until all of the low density parity check matrix, H, has undergone check node processing.

In the just described embodiments, a single sub-matrix is processed each cycle. A generalization is to process an m×n array of sub-matrices per cycle. In this approach, (n×$P_s$) bit processors are used, one for each column in the array and (m×$P_s$) check processors are used, one for each row in the array. In addition, this approach allows the use of a single unified memory, even though this memory can be broken up into smaller segments to make implementation easier.

Figure 32:
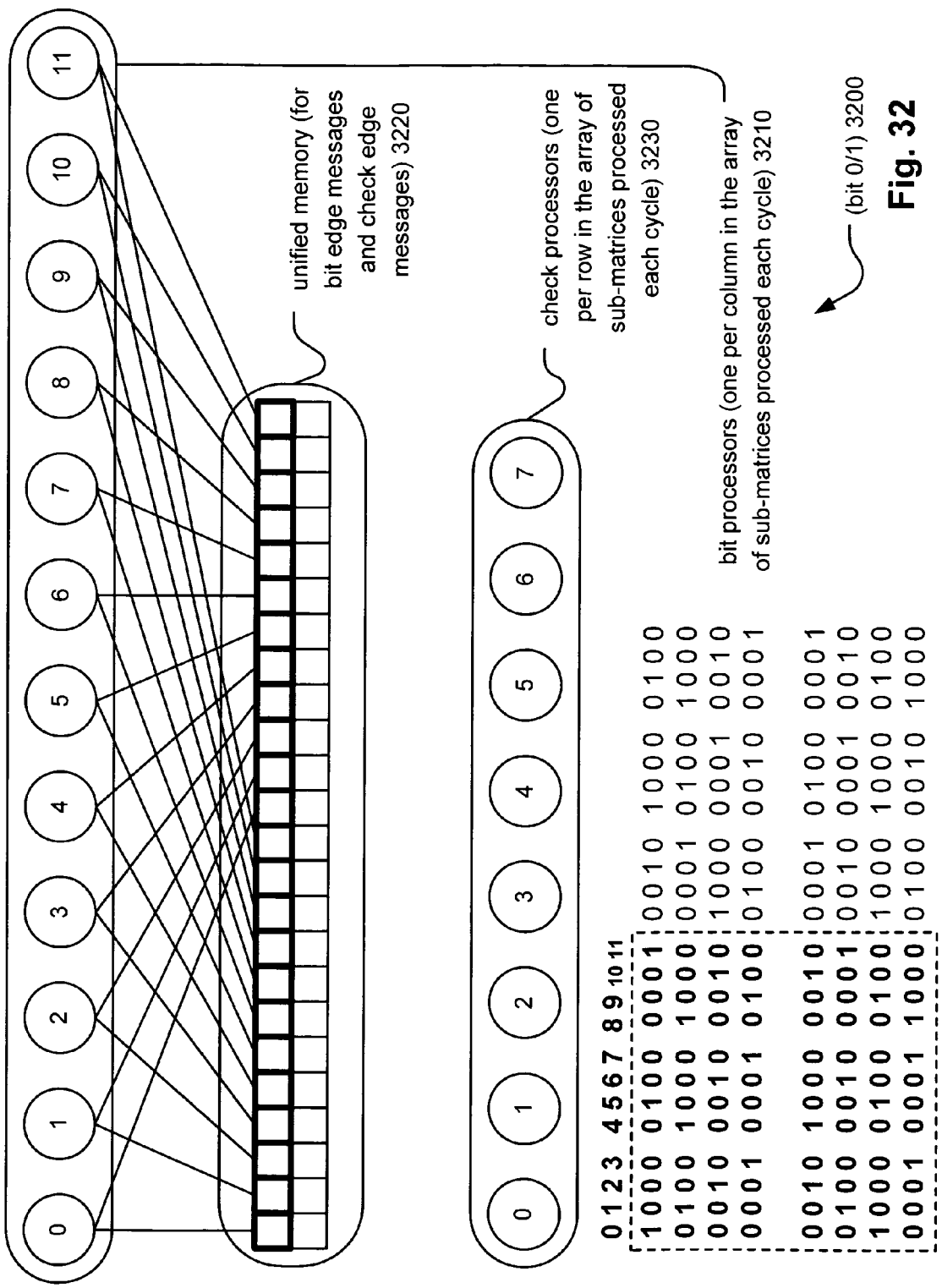

For example, FIG. 32 and FIG. 33 illustrate other embodiments 3200 and 3300 of bit node processing (0/1) and (1/1) when a 2×3 array of sub-matrices is processed each cycle. As mentioned above, a unified memory 3220 (i.e., a "single" memory) is used. In the illustrated embodiments, a 2×3 array of sub-matrices has 12 columns and 8 rows; thus, 12 bit processors 3210 and 8 check processors 3230 are employed. Also, since the low density parity check matrix, H, is a 2×6 array of sub-matrices and a 2×3 array of sub-matrices is processed each cycle, a total of 2 cycles are required to perform bit node processing. During each bit node processing cycle all bit processors concurrently communicate with the unified memory 3220. Because of the use of the unified memory 3220, no MUXes are needed. The total number of edges that are processed per cycle is (($P_s$×$M_s$×$N_s$)/2).

During the cycle (0/1) of the bit node processing (FIG. 26), the bit processors 2610 access the memory locations corresponding to the non-zero element locations of the first 2×3 array of sub-matrices. In this example, this array is the left hand side of the low density parity check matrix, H. Since there are 24 non-zero elements in the 2×3 array of sub-matrices, 24 memory locations are accessed.

During the cycle (1/1) of the bit node processing 3300 (FIG. 33), the bit processors 3210 access the memory locations corresponding to the non-zero element locations of the second 2×3 array of sub-matrices. In this example, this array is the right had side of the low density parity check matrix, H. Again, since there are 24 non-zero elements in the 2×3 array of sub-matrices, 24 new memory locations are accessed.

FIG. 34 and FIG. 35 illustrate other embodiments 3400 and 3500 of check node processing (0/1) and (1/1) when employing an approach where a 2×3 array of sub-matrices is processed each cycle. Since the low density parity check matrix, H, is a 2×6 array of sub-matrices and a 2×3 array of sub-matrices is processed each cycle, a total of 2 cycles are required to perform check node processing. During each check node processing cycle, all check processors 3230 concurrently communicate with the unified memory 3220. Because of the use of the unified memory 3220, no MUXes are needed. As mentioned above, permuters are employed to maintain proper ordering for check node processing. When using permuters (e.g., as one of which is specifically referenced as permuter 3401), then the total number of ($P_s$×$P_s$) permuters required is (($M_s$×$N_s$)/2)). Each ($P_s$×$P_s$) permuter can be implemented and capable to perform 2 permutations. The total number of edges that is processed per cycle is (($P_s$×$M_s$×$N_s$)/2).

During the cycle (0/1) of the check node processing 3400 (FIG. 34), the check processors 3230 access the memory locations corresponding to the first 2×3 array of sub-matrices. In this example, this array is the left hand side of the low density parity check matrix, H. Since there are 24 non-zero elements in the 2×3 array of sub-matrices, the 24 locations corresponding to the left hand side of the low density parity check matrix, H, are accessed.

During the cycle (1/1) of the check node processing 3500 (FIG. 35), the check processors 3230 access the memory locations corresponding to the second 2×3 array of sub-matrices. In this example, this array is the right hand side of the low density parity check matrix, H. Since there are 24 non-zero elements in the 2×3 array of sub-matrices, the 24 locations corresponding to the right hand side of the low density parity check matrix, H, are accessed.

With respect to the various embodiments depicted herein of sub-matrix based implementations of LDPC decoders, it is again noted that the edge messages can be stored to comport with either check order or bit order, whichever is desired. In addition, there are a variety of ways in which this can be achieved including using logic, addressing, and/or permutation means. In addition, the number of columns of sub-matrices processed per bit node processing cycle does not need to be the same as the number of rows of sub-matrices processed per check node processing cycle. The number of bit edge messages processed by each bit processor per cycle does not need to be the same as the number of check edge messages processed by each check processor per cycle. Moreover, these various embodiments can easily be adapted to a low density parity check matrix, H, having 1 or more sub-matrices that include all zero values.

FIG. 36 illustrates an embodiment of a method 3600 for performing bit node processing and check node processing. The method 3600 begins by performing bit node processing that involves updating a first plurality of bit edges messages corresponding to a first plurality of non-zero elements in a first column as shown in a block 3610. This first column can be viewed as being a column composed of a first plurality of sub-matrices of a low density parity check matrix that includes a plurality of sub-matrices. The method 3600 then continues by performing bit node processing that involves updating a second plurality of bit edges messages corresponding to a second plurality of non-zero elements in a second column (e.g., as defined with reference to a second plurality of sub-matrices of the low density parity check matrix).

In block 3630 and 3640, the method 3600 operates by performing check node processing. However, if desired, before doing the check node processing, the method 3600 can operate by arranging the updated first plurality of bit edges messages, according to a selective connectivity via a plurality of edges between a plurality of bit nodes and a plurality of check nodes of an LDPC bipartite graph that corresponds to the LDPC code, for use in the check node processing.

In a block 3630, the method 3600 operates by performing check node processing that involves updating a first plurality of check edges messages corresponding to a third plurality of non-zero elements in a first row of the low density parity check matrix. Then, in a block 3640, the method 3600 operates by performing bit check processing that involves updating a second plurality of check edges messages corresponding to a fourth plurality of non-zero elements in a second row of the low density parity check matrix.

Clearly, it is noted that there may be embodiments where more than 2 bit node processing steps, and more than 2 check node processing steps, may be performed without departing from the scope and spirit of the invention. This embodiment illustrates the generally processing that can be extended up to 2 or more bit node processing steps, and 2 or more check node processing steps, to accommodate any low density parity check matrix, H, having any size that is partitioned into any desired number of sub-matrices.

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a plurality of bit node processors that is operable to:
during a first time, perform bit node processing that involves updating a first plurality of bit edges messages corresponding to a first plurality of non-zero elements in a first column, that includes a first plurality of sub-matrices, of a low density parity check matrix that includes a plurality of sub-matrices; and
during a second time, perform bit node processing that involves updating a second plurality of bit edges messages corresponding to a second plurality of non-zero elements in a second column, that includes a second plurality of sub-matrices, of the low density parity check matrix; and
a plurality of check node processors that is operable to:
during a third time, perform check node processing that involves updating a first plurality of check edges messages corresponding to a third plurality of non-zero elements in a first row of the low density parity check matrix; and
during a fourth time, perform check node processing that involves updating a second plurality of check edges messages corresponding to a fourth plurality of non-zero elements in a second row of the low density parity check matrix; and
wherein the first plurality of bit edges messages, the second plurality of bit edges messages, the first plurality of check edges messages, and the second plurality of check edges messages correspond to the selective connectivity via a plurality of edges between a plurality of bit nodes and a plurality of check nodes of an LDPC (Low Density Parity Check) bipartite graph that corresponds to an LDPC code.

2. The apparatus of claim 1, further comprising:
a permuter, communicatively coupled to the plurality of check node processors, that is operable to arrange the updated first plurality of bit edges messages, according to the selective connectivity via the plurality of edges between the plurality of bit nodes and the plurality of check nodes of the LDPC bipartite graph that corresponds to the LDPC code, for use in the check node processing that involves updating the first plurality of check edges messages.

3. The apparatus of claim 1, further comprising:
a permuter, communicatively coupled to the plurality of bit node processors, that is operable to arrange the updated first plurality of check edges messages, according to the selective connectivity via the plurality of edges between the plurality of bit nodes and the plurality of check nodes of the LDPC bipartite graph that corresponds to the LDPC code, for use in subsequent bit node processing that involves updating a third plurality of bit edges messages.

4. The apparatus of claim 1, wherein:
each row of the low density parity check matrix includes at least four sub-matrices;
the third time includes a fifth time and a sixth time;
the first plurality of check edges messages includes a third plurality of check edges messages and a fourth plurality of check edges messages; and
the plurality of check node processors is operable to:
during the fifth time, perform check node processing that involves updating the third plurality of check edges messages corresponding to those non-zero elements in a first at least two sub-matrices of the plurality of sub-matrices within the first row of the low density parity check matrix; and
during the sixth time, perform check node processing that involves updating the fourth plurality of check edges messages corresponding to those non-zero elements in a second at least two sub-matrices of the plurality of sub-matrices within the first row of the low density parity check matrix.

5. The apparatus of claim 1, further comprising:
a plurality of registers; and wherein:
N is an integer;
M is an integer;
the low density parity check matrix includes a plurality of sub-matrices;
each row of the low density parity check matrix includes N sub-matrices;
each column of the low density parity check matrix includes M sub-matrices;
during the first time, each bit node processor of the plurality of bit node processors communicates with M registers of the plurality of registers; and
during the third time, each check node processor of the plurality of check node processors communicates with N registers of the plurality of registers.

6. The apparatus of claim 1, further comprising:
a plurality of registers;
a first MUX (Multiplexor); and
a second MUX; and wherein:
N is an integer;
M is an integer;
the low density parity check matrix includes a plurality of sub-matrices;
each row of the low density parity check matrix includes N sub-matrices;
each column of the low density parity check matrix includes M sub-matrices;
during the first time, the first MUX communicatively couples a first bit node processor of the plurality of bit node processors with a first M registers of the plurality of registers;
during the second time, the first MUX communicatively couples the first bit node processor of the plurality of bit node processors with a second M registers of the plurality of registers;
during the third time, the second MUX communicatively couples a first check node processor of the plurality of check node processors with a first N registers of the plurality of registers; and during the second time, the second MUX communicatively couples the first check node processor of the plurality of bit node processors with a second N registers of the plurality of registers.

7. The apparatus of claim 1, wherein:
N is an integer;
M is an integer;
P is an integer;
the low density parity check matrix includes a plurality of sub-matrices;
each sub-matrix of the plurality of sub-matrices has an order of P;
each row of the low density parity check matrix includes N sub-matrices;
each column of the low density parity check matrix includes M sub-matrices;
during the first time, P×M bit edges messages are updated; and
during the third time, P×N check edges messages are updated.

8. The apparatus of claim 1, wherein:
N is an integer;
M is an integer;
N is divisible by M without generating a remainder;
P is an integer;
the low density parity check matrix includes a plurality of sub-matrices;
each sub-matrix of the plurality of sub-matrices has an order of P;
each row of the low density parity check matrix includes N sub-matrices;
each column of the low density parity check matrix includes M sub-matrices;
during the first time, P×M bit edges messages are updated;
during the third time, P×M check edges messages are updated.

9. The apparatus of claim 1, wherein:
a bit node processor of the plurality of bit node processors employs a first processing circuitry and a second processing circuitry; and
a check node processor of the plurality of check node processors employs the first processing circuitry and a third processing circuitry.

10. The apparatus of claim 1, wherein:
when updating a bit edge message of the first plurality of bit edge messages, a bit node processor of the plurality of bit node processors performs a first calculation and a second calculation; and
when updating a check edge message of the first plurality of check edge messages, a check node processor of the plurality of check node processors performs the first calculation and a third calculation.

11. The apparatus of claim 1, wherein:
the LDPC code is a regular LDPC code or an irregular LDPC code; and
the apparatus is a decoder that is operable to perform error correction decoding of an LDPC coded signal to generate a best estimate of an information bit that has been encoded into the LDPC coded signal.

12. An apparatus, comprising:
a plurality of bit node processors that is operable to:
during a first time, perform bit node processing that involves updating a first plurality of bit edges messages corresponding to a first plurality of non-zero elements in a first at least four sub-matrices situated across a first at least two columns of a low density parity check matrix; and
during a second time, perform bit node processing that involves updating a second plurality of bit edges messages corresponding to a second plurality of non-zero elements in a second at least four sub-matrices situated across a second at least two columns of the low density parity check matrix; and
a plurality of check node processors that is operable to:
during a third time, perform check node processing that involves updating a first plurality of check edges messages corresponding to a third plurality of non-zero elements in a third at least four sub-matrices situated across a first at least two rows of the low density parity check matrix; and
during a fourth time, perform check node processing that involves updating a second plurality of check edges messages corresponding to a fourth plurality of non-zero elements in a fourth at least four sub-matrices situated across a second at least two rows of the low density parity check matrix; and wherein:
the first plurality of bit edges messages, the second plurality of bit edges messages, the first plurality of check edges messages, and the second plurality of check edges messages correspond to the selective connectivity of a plurality of edges between a plurality of bit nodes and a plurality of check nodes of an LDPC (Low Density Parity Check) bipartite graph that corresponds to an LDPC code;
the low density parity check matrix includes a plurality of sub-matrices;
each row of the low density parity check matrix includes at least two sub-matrices; and
each column of the low density parity check matrix includes at least two sub-matrices.

13. The apparatus of claim 12, wherein:
the first at least four sub-matrices is the third at least four sub-matrices; and
the second at least four sub-matrices is the fourth at least four sub-matrices.

14. The apparatus of claim 12, further comprising:
a permuter, communicatively coupled to the plurality of check node processors, that is operable to arrange the updated first plurality of bit edges messages, according to the selective connectivity via the plurality of edges between the plurality of bit nodes and the plurality of check nodes of the LDPC bipartite graph that corresponds to the LDPC code, for use in the check node processing that involves updating the first plurality of check edges messages.

15. The apparatus of claim 12, further comprising:
a permuter, communicatively coupled to the plurality of bit node processors, that is operable to arrange the updated first plurality of check edges messages, according to the selective connectivity via the plurality of edges between the plurality of bit nodes and the plurality of check nodes of the LDPC bipartite graph that corresponds to the LDPC code, for use in subsequent bit node processing that involves updating a third plurality of bit edges messages.

16. The apparatus of claim 12, further comprising:
a plurality of registers; and wherein:
N is an integer;
M is an integer;
each sub-matrix of the plurality of sub-matrices has an order of P;
each row of the low density parity check matrix includes N sub-matrices;

each column of the low density parity check matrix includes M sub-matrices;

during the first time, each bit node processor of the plurality of bit node processors communicates with M/2 registers of the plurality of registers such that P×M×2 bit edges messages are updated;

during the third time, each check node processor of the plurality of check node processors communicates with M/2 registers of the plurality of registers such that P×M×2 check edges messages are updated.

17. The apparatus of claim 12, further comprising:

a plurality of registers; and wherein:

N is an integer;

M is an integer;

each sub-matrix of the plurality of sub-matrices has an order of P;

each row of the low density parity check matrix includes N sub-matrices;

each column of the low density parity check matrix includes M sub-matrices;

during the first time, each bit node processor of the plurality of bit node processors communicates with one registers of the plurality of registers such that (P×M×N)/2 bit edges messages are updated;

during the third time, each check node processor of the plurality of check node processors communicates with one registers of the plurality of registers such that (P×M×N)/2 check edges messages are updated.

18. A method, comprising:

during a first time, performing bit node processing that involves updating a first plurality of bit edges messages corresponding to a first plurality of non-zero elements in a first column, that includes a first plurality of sub-matrices, of a low density parity check matrix that includes a plurality of sub-matrices;

during a second time, performing bit node processing that involves updating a second plurality of bit edges messages corresponding to a second plurality of non-zero elements in a second column, that includes a second plurality of sub-matrices, of the low density parity check matrix;

during a third time, performing check node processing that involves updating a first plurality of check edges messages corresponding to a third plurality of non-zero elements in a first row of the low density parity check matrix; and during a fourth time, performing check node processing that involves updating a second plurality of check edges messages corresponding to a fourth plurality of non-zero elements in a second row of the low density parity check matrix, wherein the first plurality of bit edges messages, the second plurality of bit edges messages, the first plurality of check edges messages, and the second plurality of check edges messages correspond to the selective connectivity via a plurality of edges between a plurality of bit nodes and a plurality of check nodes of an LDPC (Low Density Parity Check) bipartite graph that corresponds to an LDPC code 19. The method of claim 18, further comprising:

arranging the updated first plurality of bit edges messages, according to the selective connectivity via the plurality of edges between the plurality of bit nodes and the plurality of check nodes of the LDPC bipartite graph that corresponds to the LDPC code, for use in the check node processing that involves updating the first plurality of check edges messages.

20. The method of claim 18, wherein:

each row of the low density parity check matrix includes at least four sub-matrices;

the third time includes a fifth time and a sixth time;

the first plurality of check edges messages includes a third plurality of check edges messages and a fourth plurality of check edges messages; and further comprising:

during the fifth time, performing check node processing that involves updating the third plurality of check edges messages corresponding to those non-zero elements in a first at least two sub-matrices of the plurality of sub-matrices within the first row of the low density parity check matrix; and during the sixth time, performing check node processing that involves updating the fourth plurality of check edges messages corresponding to those non-zero elements in a second at least two sub-matrices of the plurality of sub-matrices within the first row of the low density parity check matrix.

* * * * *